(12) United States Patent
Shaw et al.

(10) Patent No.: US 7,053,381 B2
(45) Date of Patent: May 30, 2006

(54) DUAL PARA-XYLYLENE LAYERS FOR AN X-RAY DETECTOR

(75) Inventors: Jeffrey Jon Shaw, Ballston Lake, NY (US); Ching-Yeu Wei, Niskayuna, NY (US); David Francis Fobare, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 314 days.

(21) Appl. No.: 10/631,197

(22) Filed: Jul. 30, 2003

(65) Prior Publication Data

US 2004/0021084 A1    Feb. 5, 2004

Related U.S. Application Data

(63) Continuation-in-part of application No. 10/003,839, filed on Dec. 6, 2001, now Pat. No. 6,720,561.

(51) Int. Cl.
*G01T 1/202* (2006.01)

(52) U.S. Cl. .............. 250/370.11; 250/370.09; 250/367; 250/483.1

(58) Field of Classification Search ........... 250/370.11, 250/370.09, 367, 483.1
See application file for complete search history.

(56) References Cited

U.S. PATENT DOCUMENTS

| | | | |
|---|---|---|---|
| 4,011,454 A | 3/1977 | Lubowski et al. | |
| 4,069,355 A | 1/1978 | Lubowski et al. | |
| 5,132,539 A | 7/1992 | Kwasnick et al. | |
| 5,153,438 A | 10/1992 | Kingsley et al. | |
| 5,171,996 A | 12/1992 | Perez-Mendez | |
| 5,179,284 A | 1/1993 | Kingsley et al. | |
| 5,187,369 A | 2/1993 | Kingsley et al. | |
| 5,227,635 A | 7/1993 | Iwanczyk | |
| 5,336,928 A | 8/1994 | Neugebauer, deceased et al. | |
| 5,359,496 A | 10/1994 | Kornrumpf et al. | |
| 5,368,882 A | 11/1994 | Tran et al. | |
| 5,401,668 A | 3/1995 | Kwasnick et al. | |
| 5,460,980 A | 10/1995 | Tran et al. | |
| 5,654,084 A | 8/1997 | Egert | |
| 6,146,489 A | 11/2000 | Wirth | |
| 6,204,506 B1 | 3/2001 | Akahori et al. | |
| 6,262,422 B1 | 7/2001 | Homme et al. | |
| 6,278,118 B1 | 8/2001 | Homme et al. | |

FOREIGN PATENT DOCUMENTS

| | | |
|---|---|---|
| EP | 0903590 B1 | 2/2002 |
| EP | 0932053 B1 | 9/2002 |

*Primary Examiner*—Otilia Gabor
*Assistant Examiner*—Christine Sung
(74) *Attorney, Agent, or Firm*—Fletcher Yoder

(57) ABSTRACT

The present invention provides an X-ray detector assembly and a fabrication method, where the X-ray detector assembly includes a scintillator material disposed on a detector matrix array disposed on a detector substrate; and an encapsulating coating disposed on the scintillator material. The encapsulating coating includes a combination of a mono-chloro-poly-para-xylylene layer and a poly-para-xylylene layer. In one embodiment, a poly-para-xylylene layer is disposed over the scintillator material and a mono-chloro-poly-para-xylylene layer is disposed over the poly-para-xylylene layer.

7 Claims, 12 Drawing Sheets

DUAL PARA-XYLYLENE LAYERS FOR AN X-RAY DETECTOR

CROSS-REFERENCE TO RELATED APPLICATIONS

This application is a continuation-in-part of U.S. patent application Ser. No. 10/003839, entitled "Direct CsI Scintillator Coating For Improved Digital X-Ray Detector Assembly Longevity", filed Dec. 6, 2001 now U.S. Pat. No. 6,720,561.

STATEMENT REGARDING FEDERALLY SPONSORED RESEARCH AND DEVELOPMENT

The United States Government may have certain rights in this invention pursuant to contract number 70NANB5H1148 awarded by the United States Department of National Institute of Standards and Technology.

BACKGROUND OF THE INVENTION

This invention relates generally to the field of X-ray detector assemblies for medical imaging and more particularly to the construction of X-ray detector assemblies with dual para-xylylene layers.

In an X-ray detector assembly, an amorphous silicon detector substrate is coated with a vapor phase deposited X-ray scintillator material. The scintillator material generates photons isotropically from the absorption of the X-rays. A reflective layer is required to reflect photons, which are emitted in a direction away from the detector substrate, back towards the detector substrate. A typical reflective layer (such as an Opticlad™ film, a registered trademark product available from the General Electric Company, Pittsfield, Mass.) covers the scintillator material. A detector matrix array subsequently measures the intensity of these photons. A moisture resistant seal is disposed between a moisture resistant cover and the detector substrate near the periphery of the X-ray detector assembly.

One important factor in medical imaging applications is in the detector spatial resolution. Photons, which are generated in the scintillator material over one detector pixel, must be counted only by that underlying pixel to obtain a high image resolution. Photons that are scattered to adjacent pixels reduce the clarity of the image. To this end, the scintillator material is vapor deposited in columnar or needle form. Individual needles are separated from one another and they possess aspect ratios (length/diameter) of 100 or greater. Photons traveling down the scintillator needles tend to be contained within the individual needle due to the higher refractive index of scintillator material over air, provided that the individual scintillator needles remain separated. The Cesium Iodide (CsI) scintillator material is known to be a very hydroscopic salt. Exposure of the CsI scintillator material to moisture can cause the CsI scintillator material to absorb the moisture, which further causes the individual CsI scintillator needles to fuse together.

One source of moisture that could effect the CsI scintillator material is the moisture that is contained in the pressure sensitive adhesive (PSA) layer of the Opticlad™ film that is used to attach the Opticlad™ film to the scintillator material. This Opticlad™ film reflective layer is placed over, and is in direct contact with, the CsI scintillator material.

However, applying the reflective layer reduces the detector image spatial resolution after the X-ray detector assembly is heated for several months at a temperature range between about 30 and about 35 degrees C. (e.g., conditions approximating normal operating environment). The MTF (Modulation Transfer Function) of the X-ray detector assembly is reduced, by a value of about 20% or greater, as a result of the moisture contained with in the PSA layer of the Opticlad™ film. The MTF is defined as the modulation of the image divided by the modulation of the object. Where:

$$\text{Modulation} = \frac{(\text{maximum luminance} - \text{minimum luminance})}{(\text{maximum luminance} + \text{minimum luminance})}$$

A second source of moisture is ambient environment moisture diffusion through the moisture resistant seal that bonds the moisture resistant cover to the detector substrate. This ambient environment moisture can degrade X-ray detector assembly performance. A third source of moisture is the moisture that is absorbed by the CsI scintillator material during X-ray detector assembly fabrication outside of the dry vacuum environment before sealing the detector substrate to the-moisture resistant cover. Unless the X-ray detector assembly is sealed in a controlled, very low relative humidity ambient, the CsI scintillator material is exposed to moisture vapor during the assembly process during application of the moisture resistant seal. The CsI scintillator material has the potential to absorb moisture, which can degrade the performance of the X-ray detector assembly.

It is desirable to have an X-ray detector assembly design that minimizes the amount of moisture absorbed by the scintillator material from moisture sources inside the X-ray detector assembly. It is further desirable to have a robust seal assembly that protects the scintillator material and the structure holding the scintillator material from penetration by ambient moisture. It is further desirable to physically protect the X-ray detector assembly from damage caused by handling. It is also desirable that any encapsulating coating disposed over the scintillator material be easy to apply at temperatures less than about 250 degrees C. and the encapsulating coating fully contain the high aspect ratio scintillator needles. It is further desirable that any encapsulating coating forms a mold-like structure, reducing the moisture that can get into the CsI scintillator material, and constrain the CsI scintillator needles from touching adjacent scintillator needles to reduce X-ray picture degradation. It is further desirable that the encapsulating coating applies no distortion onto the scintillator material.

SUMMARY

In one embodiment of the present invention there is an X-ray detector assembly. In this embodiment, the X-ray detector comprises a substrate; a detector matrix array disposed on the substrate; a scintillator material disposed on the detector matrix array; and an encapsulating coating disposed on the scintillator material, wherein the encapsulating coating comprises a combination of a mono-chloro-poly-para-xylylene layer and a poly-para-xylylene layer.

In another embodiment, the X-ray detector comprises a substrate; a detector matrix array disposed on the substrate; a scintillator material disposed on the detector matrix array; and an encapsulating coating disposed on the scintillator material, wherein the encapsulating coating comprises a poly-para-xylylene layer disposed over the scintillator material and a mono-chloro-poly-para-xylylene layer disposed over the poly-para-xylylene layer.

In a third embodiment, the X-ray detector comprises a substrate; a detector matrix array disposed on the substrate; a scintillator material disposed on the detector matrix array; and an encapsulating coating disposed on the scintillator material, wherein the encapsulating coating comprises a poly-para-xylylene layer having a thickness ranging from about 0.01 microns to about 3 microns disposed over the scintillator material and a mono-chloro-poly-para-xylylene layer having a thickness ranging from about 2 microns to about 10 microns disposed over said poly-para-xylylene layer.

BRIEF DESCRIPTION OF THE DRAWINGS

These and other features, aspects and advantages of the present invention will become better understood when the following detailed description is read with reference to the accompanying drawings in which like characters represent like parts throughout the drawings, wherein.

DETAILED DESCRIPTION OF THE INVENTION

Figure 1:
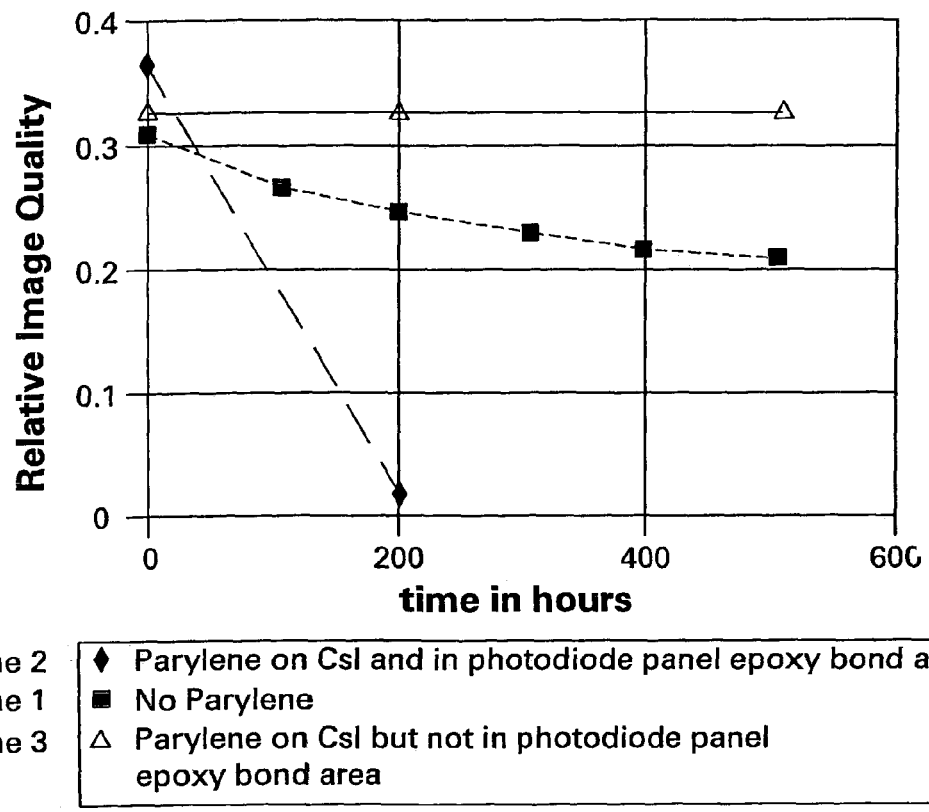
FIG. 1 is a chart depicting an X-ray detector assembly relative image quality results with and without utilizing a mono-chloro-poly-para-xylylene material as the encapsulating coating disposed on the detector substrate adhesive bond area.

The present invention provides an X-ray detector assembly that has a scintillator material disposed on a detector matrix array that is disposed on a detector substrate. An encapsulating coating is disposed on the scintillator material. A moisture resistant cover is disposed over the detector substrate and the encapsulating coating. An adhesive material is disposed between the detector substrate and the moisture resistant cover so as to form a moisture vapor barrier, wherein the adhesive material is disposed so that it is not in contact with the encapsulating coating.

The encapsulating coating is disposed directly onto the scintillator needles of the scintillator material to reduce scintillator performance degradation resulting from the scintillator material absorbing moisture when the scintillator material is exposed to moisture.

A successful encapsulating coating should possess a combination of properties including low stress, low moisture permeability, low X-ray, and light absorption, and non-reactivity with scintillator needles. Various mechanisms are envisioned by which these encapsulating coatings prevent degradation of scintillator performance resulting from the absorption of moisture during an exposure of the scintillator needles to moisture. The "encapsulating coating" as used herein is defined to mean that the encapsulating coating is deposited between the scintillator needle structure all the way to the bottom of each of the scintillator needles along all of the sidewalls of all of the scintillator needles. The encapsulating coating also has the ability to mold over the scintillator material to maintain a useful columnar scintillator structure even after the scintillator material has absorbed some moisture after having been exposed to moisture.

In all cases, the encapsulating coating should be deposited in a manner that does not substantially expose the scintillator material to a moisture-containing atmosphere either before or during the deposition process.

One suitable encapsulating coating comprises at least one polymer comprising para-xylylene moieties as structural units. In various embodiments, the polymers may comprise structural units derived from unsubstituted or substituted para-xylylene moieties. Illustrative examples of substituted para-xylylene moieties include but are not limited to mono-chloro-para-xylylene and di-chloro-para-xylylene. In the present invention the term parylene™, (a trademark of the Specialty Coating Systems, Inc. 5701 West Minnesota St. Indianapolis, Ind. 46241), is used to refer to both the polymers comprising structural units derived from unsubstituted or substituted para-xylylene moieties. In one embodiment of the present invention, and at least one polymer comprising para-xylylene moieties as structural units is typically vapor deposited. Alternatively, plasma polymerized hexamethyl disiloxane or a polymerized fluorine-containing hydrocarbon such as a polymerized fluoroethylene may be utilized as a suitable encapsulating coating. Alternatively, an inorganic barrier material such as $MgF_2$, SiO, $SiO_2$, $TiO_2$ or another inorganic material may be deposited using any of several deposition processes such as electron beam evaporation, sputtering, or chemical vapor deposition.

Figure 5:
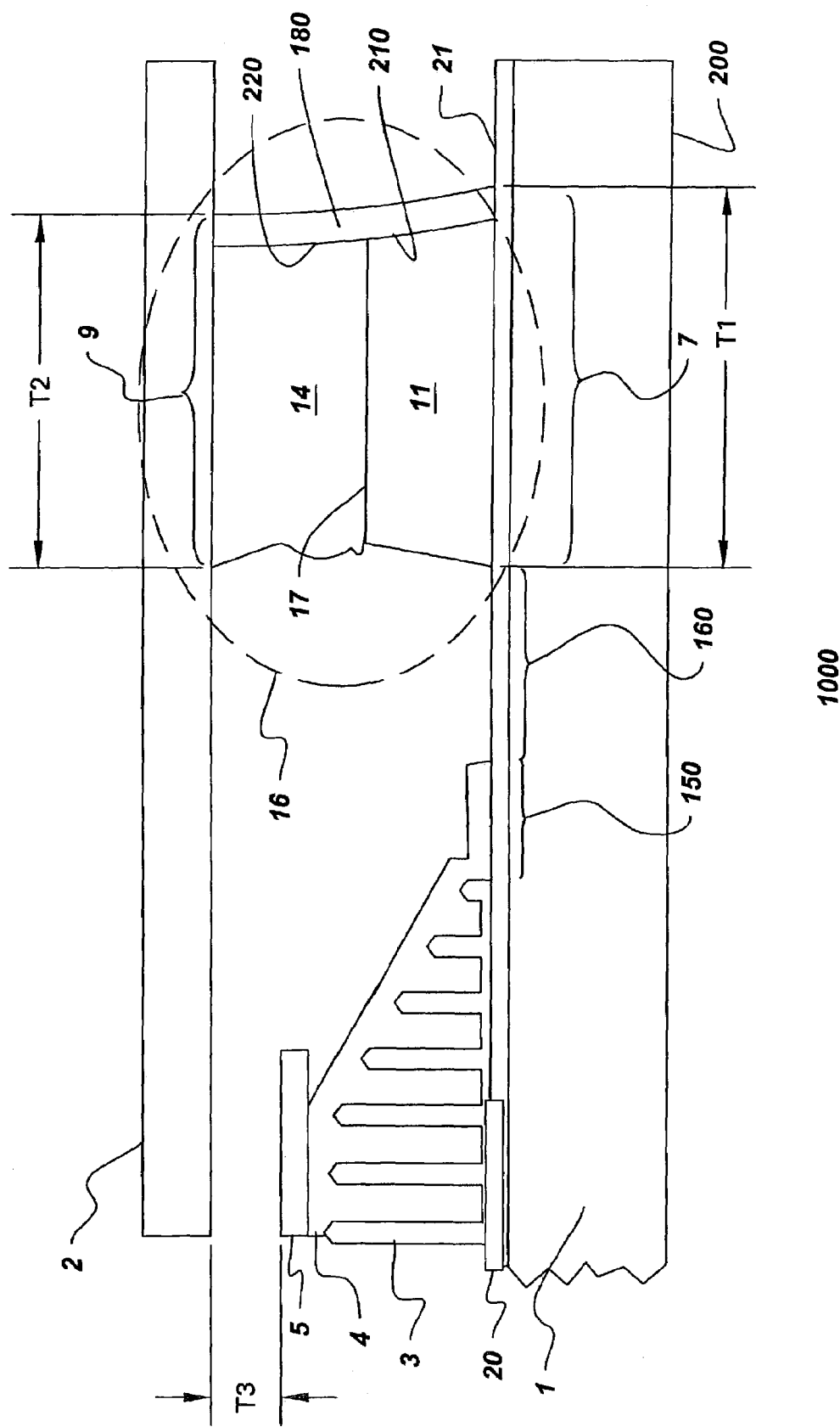
FIGS. 5, 6, 7, 8, 9, 10, 11, and 12 are cross sectional representations of X-ray detectors in accordance with different embodiments of the present invention.

The encapsulating coating is directly deposited onto scintillator needles to prevent performance degradation of a scintillator material 3 of FIG. 5 resulting from moisture exposure. CsI scintillator material was used in one embodiment of the present invention; however, other scintillator materials would also be acceptable. A parylene™ layer has been used as a common encapsulating coating in a particular embodiment of the present invention of the X-ray detector assembly. In one embodiment of the present invention the parylene™ layer is selected from a group consisting from a poly-para-xylylene material (parylene™ N), a mono-chloro-poly-para-xylylene material (parylene™ C), a di-chloro-poly-para-xylylene material (parylene™ D), and combinations thereof. Preferably, the parylene™ layer comprises a combination of a mono-chloro-poly-para-xylylene layer and a poly-para-xylylene layer. In particular, a poly-para-xylylene layer is disposed over the scintillator material and a mono-chloro-poly-para-xylylene layer is disposed over the poly-para-xylylene layer. In this embodiment, the poly-para-xylylene layer has a thickness ranging from about 0.01 microns to about 3 microns and the mono-chloro-poly-para-xylylene layer has a thickness ranging from about 2 microns to about 10 microns.

A series of six (6) tests were conducted using the mono-chloro-poly-para-xylylene material as the encapsulating coating.

In a test setup, a two step thermoset epoxy material with a curing temperature of less than about 100 degrees C. was utilized as an adhesive material. By way of example and not limitation, the herein arrangement is described with reference to FIG. 5 to aid in presentation of the test data. A first epoxy layer (layer 11 of FIG. 5) was disposed onto a detector substrate adhesive bond area (area 7 of FIG. 5). A second epoxy layer (layer 14 of FIG. 5) was disposed onto a moisture resistant cover adhesive bond area (area 9 of FIG. 5) so that second epoxy layer contacted first epoxy layer at an interface (interface 17 of FIG. 5). In the first three tests, three different encapsulating coating configurations in the detector substrate adhesive bond area were tested to determine the mono-chloro-poly-para-xylylene material effect on the resulting epoxy bond strength in the moisture vapor dual epoxy barrier (barrier 16 in FIG. 5).

In the first test, the baseline configuration was tested. In the baseline configuration, no encapsulating coating covered the scintillator material, and no encapsulating coating covered detector substrate adhesive bond area (area 7 as illustrated in FIG. 5). Line 1 of FIG. 1 depicts the decrease in relative image quality as a function of X-ray detector assembly operational hours.

In the second test, the encapsulating coating (similar to layer 4 of FIG. 5) was deposited on the scintillator material. The encapsulating coating was disposed in between a first epoxy layer (e.g., similar to layer 11 of FIG. 5) and detector substrate adhesive bond area (similar to area 7 of FIG. 5). A second epoxy layer was then disposed on the moisture resistant cover and the cover was bonded to the first epoxy layer. The presence of the encapsulating coating in detector substrate adhesive bond area resulted in low epoxy bond strength in the moisture vapor barrier, as shown by Line 2 of FIG. 1. The second test results indicate that poor epoxy bonding occurs between first epoxy layer and detector substrate, when encapsulating coating is disposed at detector substrate adhesive bond area. An X-ray detector assembly prepared in this manner failed life testing at 85 degrees C. and at 85 percent relative humidity after a few hundred hours. This low strength epoxy bond in the moisture vapor barrier was the result of having the first epoxy layer bonded to the encapsulating coating rather than having the first epoxy layer bonded to detector substrate adhesive bond area as in the baseline configuration (Line 1 of FIG. 1).

In the third test, the encapsulating coating covered the scintillator material. However, encapsulating coating was not present in detector substrate adhesive bond area (area 7 of FIG. 5). First epoxy layer was disposed on detector substrate adhesive bond area. Second epoxy layer was then disposed on moisture resistant cover and first epoxy layer so as to contact first epoxy layer at interface (interface 17 of FIG. 5) in the moisture vapor barrier. Line 3 of FIG. 1 provides a depiction of the improvement in relative image quality as a function of X-ray detector assembly operational hours, compared to the baseline configuration (no mono-chloro-poly-para-xylylene material—Line 1 of FIG. 1) and the configuration with mono-chloro-poly-para-xylylene material in detector substrate adhesive bond area (Line 2 of FIG. 1). When the mono-chloro-poly-para-xylylene material was not present in the detector substrate adhesive bond area, the X-ray detector assembly image quality did not substantially degrade over time, out through about 500 operational hours.

Three additional tests (4, 5, and 6) were performed with three different configurations of encapsulating coating at the interface (interface 17 of FIG. 5), where the mono-chloro-poly-para-xylylene material was utilized as the encapsulating layer. This testing was designed to determine the effect of the mono-chloro-poly-para-xylylene material on the epoxy bond strength at interface 17 in the moisture vapor barrier. In all three of these tests, first epoxy layer was disposed on the detector, substrate adhesive bond area prior to coating the scintillator material with the encapsulating coating. As learned from the first three test results, depositing first epoxy layer prior to applying mono-chloro-poly-para-xylylene material assisted in establishing good epoxy bond strength where first epoxy layer was disposed to detector substrate adhesive bond area. In test 4, the encapsulating coating (layer 4 of FIG. 3) extended across the width of the interface (interface 17 of FIG. 3) by about 100% as illustrated in FIG. 3; in test 5, the encapsulating coating (layer 4 of FIG. 4) extended across about 50% of the width of the interface (interface 17 of FIG. 4) as illustrated in FIG. 4; and in test 6, the encapsulating coating (layer 4 of FIG. 5) was kept separate from the interface (interface 17 of FIG. 5), as illustrated in FIG. 5.

Figure 2:
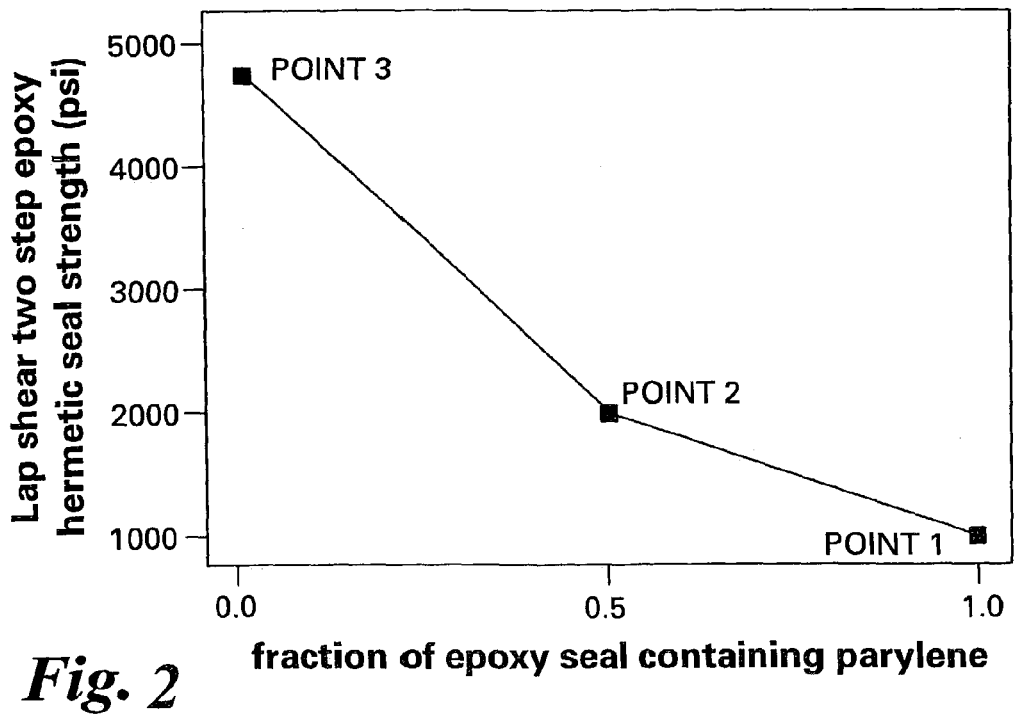
FIG. 2 is a chart depicting a two (2) step epoxy lap shear strength for the epoxy bond in moisture vapor barrier with and without utilizing a mono-chloro-poly-para-xylylene material as the encapsulating coating therebetween.
Figure 3:
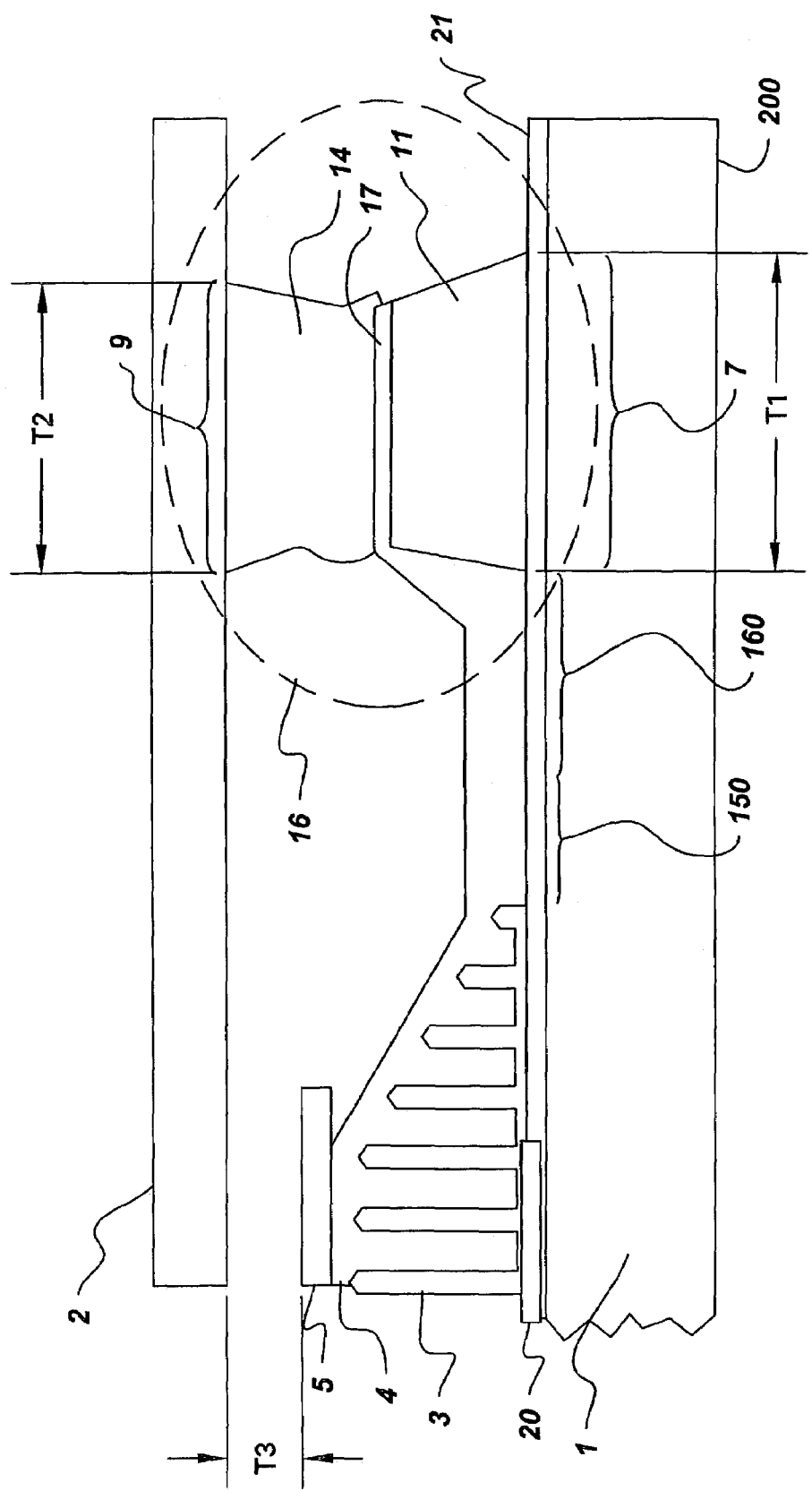
FIGS. 3 and 4 are cross sectional representations of X-ray detectors with a encapsulating coating disposed between a first epoxy layer and a second epoxy layer in moisture resistant dual epoxy seal in accordance with different embodiments of the test setups.

The fourth test was conducted with the mono-chloro-poly-para-xylylene material as the encapsulating coating 4 of FIG. 3 covering about 100% of the width of interface 17. Second epoxy layer 14 was disposed to the mono-chloro-poly-para-xylylene material at interface 17 and to moisture resistant cover 2. The resulting epoxy bond lap shear strength of the moisture vapor dual epoxy barrier 16 is depicted as point 1 in FIG. 2. It is believed that the low epoxy bond strength in the moisture vapor barrier 8 of FIG. 3 at interface 17 was the result of the presence of encapsulating coating 4 disposed between first epoxy layer 11 and second epoxy layer 14.

Figure 4:
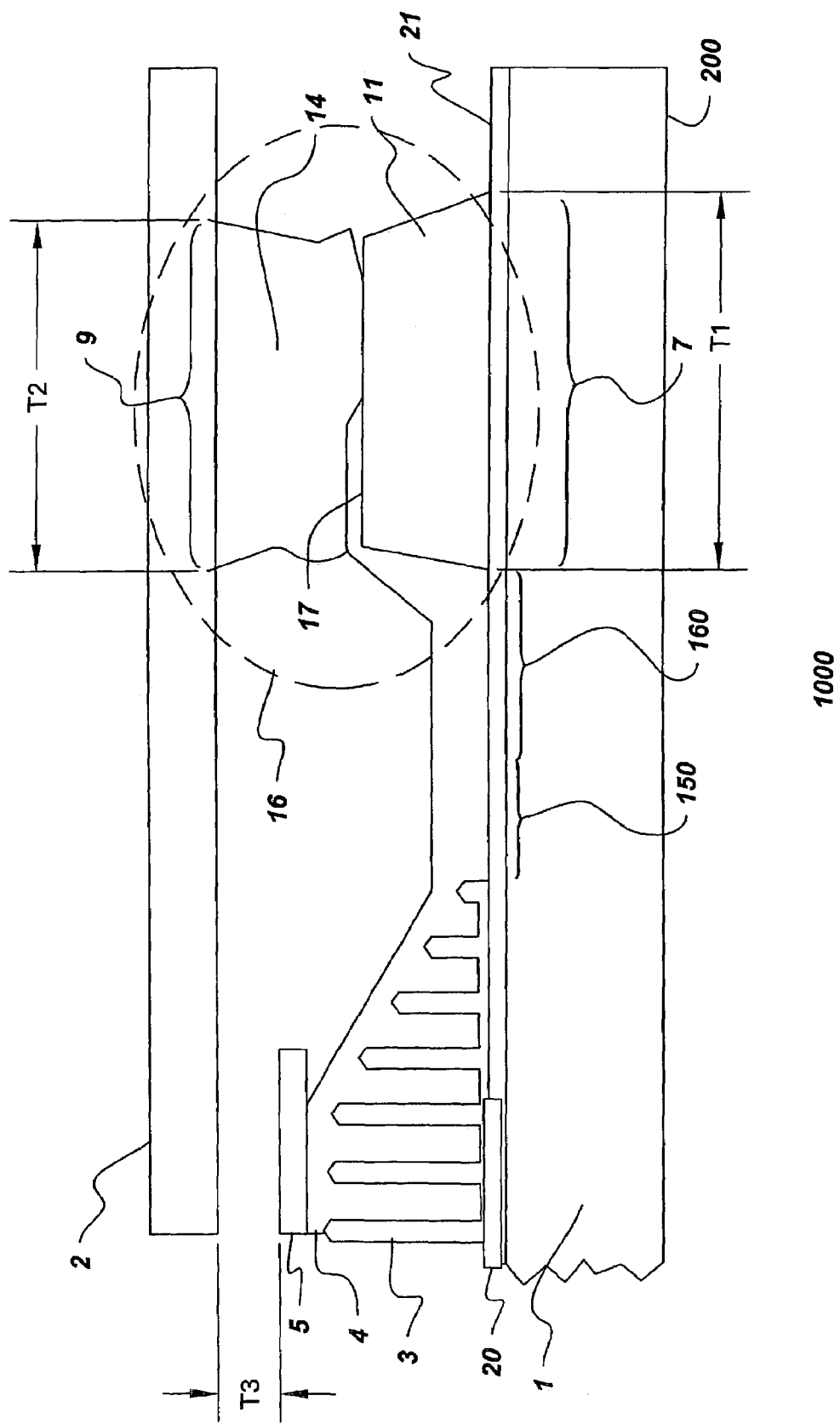

The fifth test was conducted with the mono-chloro-poly-para-xylylene material as the encapsulating material 4 of FIG. 4 covering about 50% of the width of interface 17. Second epoxy layer 14 was disposed to mono-chloro-poly-para-xylylene material and first epoxy layer 11 at interface 17. Restricting the mono-chloro-poly-para-xylylene material to about 50% of the width of interface 17 provided improved epoxy bond lap shear strength in the moisture vapor dual epoxy barrier 16 as shown as point 2 in FIG. 2. At point 2 of FIG. 2, the epoxy strength was higher than the test 4 (point 1) results, where the mono-chloro-poly-para-xylylene material covered the entire interface 17 of FIG. 4. It is believed that the resulting higher epoxy bond strength in the moisture vapor dual epoxy barrier 16 at interface 17 was the result of about half as much mono-chloro-poly-para-xylylene material disposed between first epoxy layer 11 and second epoxy layer 14 compared to the fourth test configuration.

The sixth test was conducted such that interface 17 of FIG. 5 was not in contact with the mono-chloro-poly-para-xylylene material as the encapsulating material 4 in the moisture vapor dual epoxy barrier 16. Second epoxy layer 14 and first epoxy layer 11 were disposed at interface 17 with no encapsulating coating present in interface 17. Removing the encapsulating coating from interface 17 provided improved epoxy bond lap shear strength in the moisture vapor dual epoxy barrier 16 as shown as point 3 in FIG. 2. Compared to both test 4 and test 5 results, it is understood that the improved epoxy bond lap shear strength in moisture vapor dual epoxy barrier 16 of FIG. 5 at interface 17 was the result of ensuring that interface 17 was not in contact with the mono-chloro-poly-para-xylylene material.

Test results generated from tests 1, 2 and 3 indicated that the decrease in relative image quality as a function of X-ray detector assembly operational hours is related to the amount of mono-chloro-poly-para-xylylene material in detector substrate adhesive bond area 7 of the moisture vapor dual epoxy barrier 16 when the mono-chloro-poly-para-xylylene material is utilized as the encapsulating coating. The test results of tests 4, 5, and 6 indicated that the decrease in epoxy bond lap shear strength in the moisture vapor dual epoxy barrier 16 is proportional to the amount of the mono-chloro-poly-para-xylylene material in interface 17.

Figure 6:
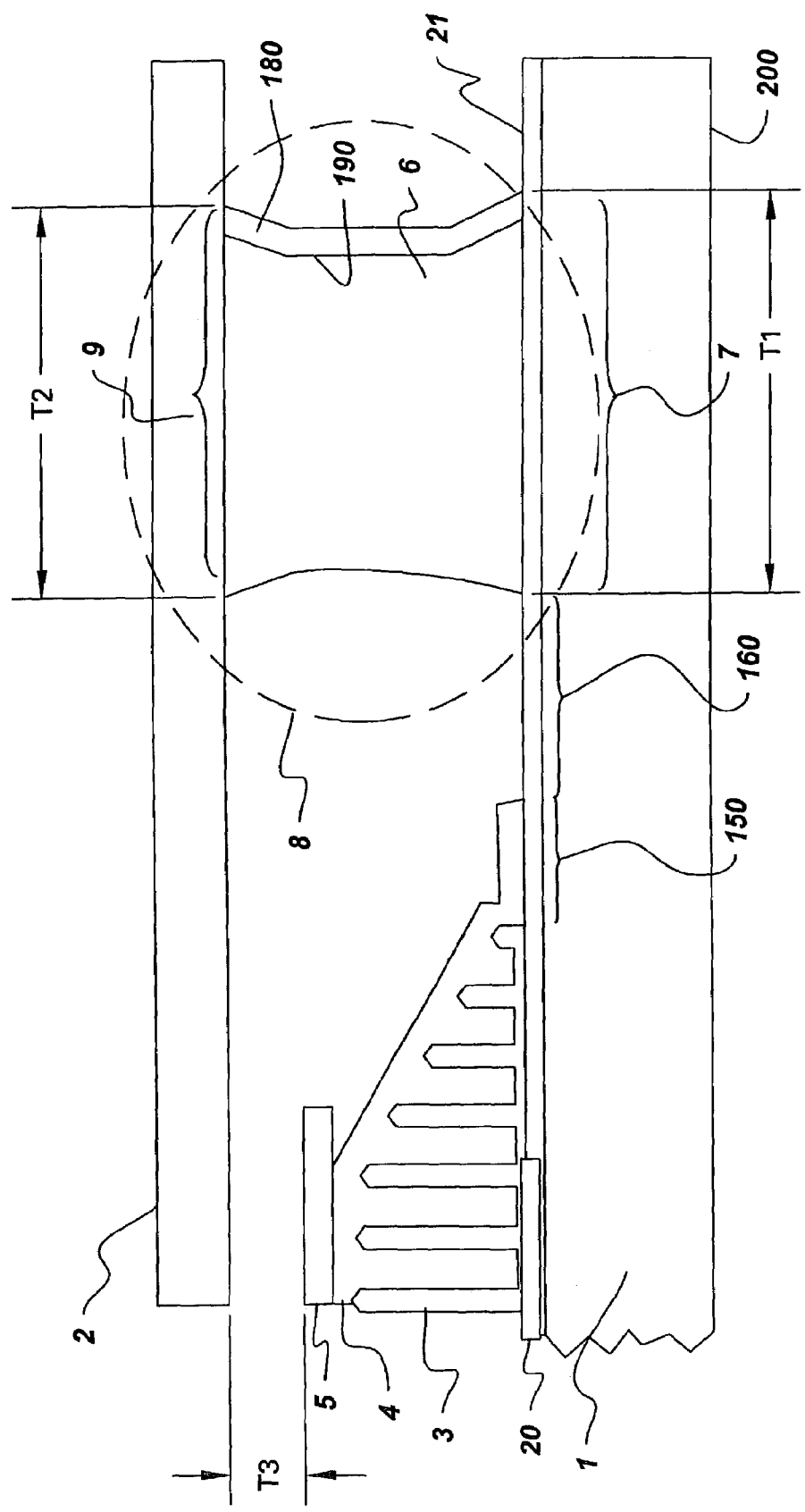

In one embodiment of the present invention, an X-ray detector assembly 1000, comprises scintillator material 3 disposed on the detector matrix array 20 and the detector matrix array 20 is disposed on the detector substrate 1 (FIG. 6). The encapsulating coating 4, typically comprises at least one polymer comprising para-xylylene moieties as structural units, is disposed on scintillator material 3 and a detector substrate first portion 150. Moisture resistant cover 2 is disposed over detector substrate 1 and is disposed over encapsulating coating 4. As used herein, detector matrix array 20 typically refers to an array of photosensors disposed for detecting photons passing from the scintillator material 3 in response to incident radiation. Adhesive material 6 is disposed between detector substrate 1 and moisture resistant cover 2 so as to form a moisture vapor barrier 8, adhesive material 6 is disposed so that it is not in contact with encapsulating coating 4.

In the illustrations of the detector assembly 1000 in FIGS. 3–12, scintillator material 3 typically comprises a CsI material disposed in a CsI needle structure. The CsI needle structure commonly comprises a thallium doping material.

The encapsulating coating 4 typically comprises at least one polymer comprising para-xylylene moieties as structural units. In various embodiments, the polymers may comprise structural units derived from unsubstituted or substituted para-xylylene moieties. In one embodiment of the present invention, the encapsulating coating is selected form a group consisting of poly-para-xylylene material (parylene™ N), mono-chloro-poly-para-xylylene material (parylene™ C), di-chloro-poly-para-xylylene material (parylene™ D), and combinations thereof. Preferably, the encapsulating coating comprises a combination of a mono-chloro-poly-para-xylylene layer and a poly-para-xylylene layer. In particular, a poly-para-xylylene layer is disposed over the scintillator material and a mono-chloro-poly-para-xylylene layer is disposed over the poly-para-xylylene layer. In this embodiment, the poly-para-xylylene layer has a thickness ranging from about 0.01 microns to about 3 microns and the mono-chloro-poly-para-xylylene layer has a thickness ranging from about 2 microns to about 10 microns.

Figure 13:
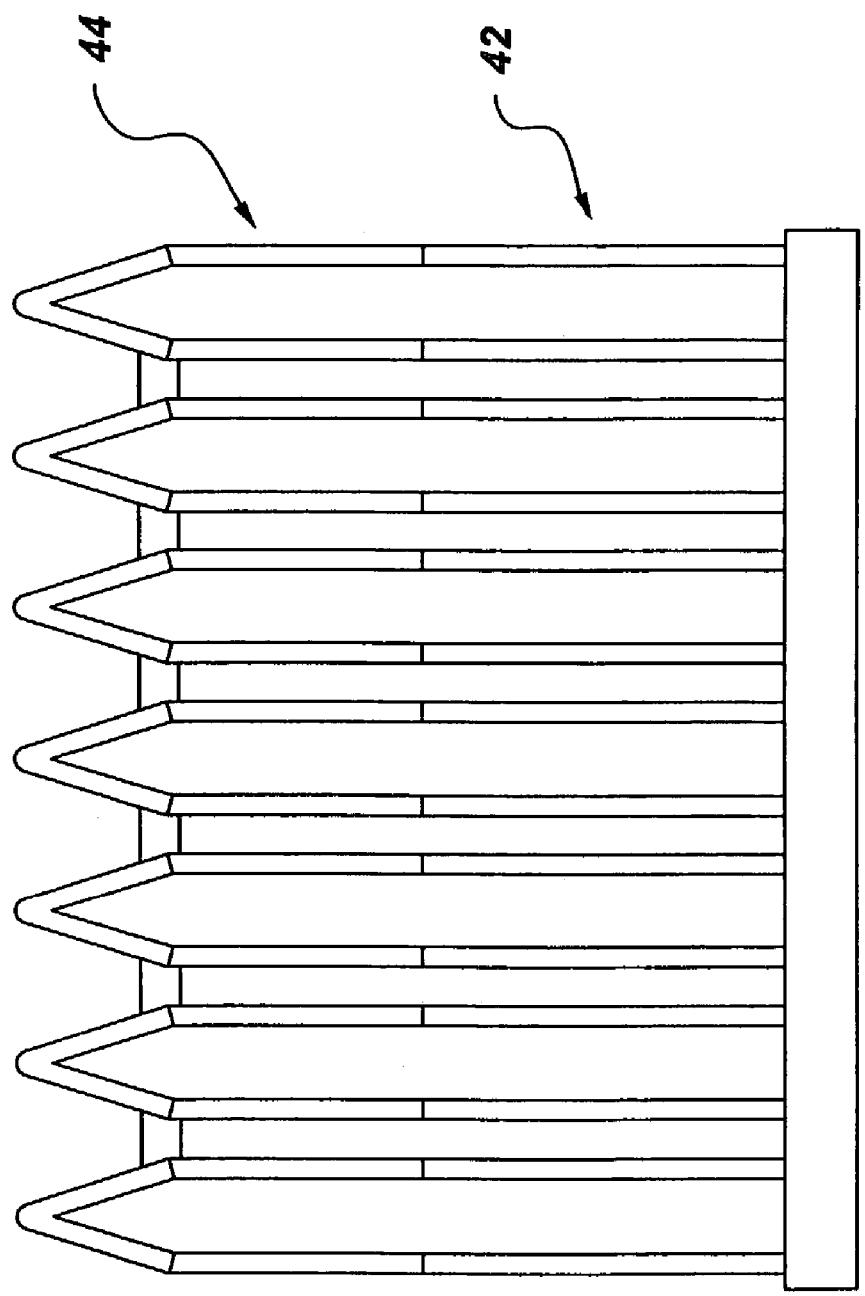
FIG. 13 is a schematic of the encapsulating coating disposed over a scintillator material in an X-ray detector according to one embodiment of the present invention.

FIG. 13 is a schematic showing the encapsulating coating 4 disposed over a scintillator material 3 in an X-ray detector according to one embodiment of the present invention. A thin layer of poly-para-xylylene 42, which is more effective at penetrating small crevices than is mono-chloro-poly-para-xylylene, is deposited first and provides a more uniform coating along the entire length of the needle structure than would mono-chloro-poly-para-xylylene. This provides a more effective encapsulation and thus longer product life. The poly-para-xylylene layer must be thin enough that it does not start to fill in the voids between individual Cesium Iodide needles, which would lead to increased spreading of light in the scintillator and thus poorer image quality. Disposed on top of the thin poly-para-xylylene layer is a layer of mono-chloro-poly-para-xylylene 44. This layer provides a stable surface onto which the reflective tier 124 may be disposed. Thus longer lifetime and optimum image quality is achieved.

Figure 12:
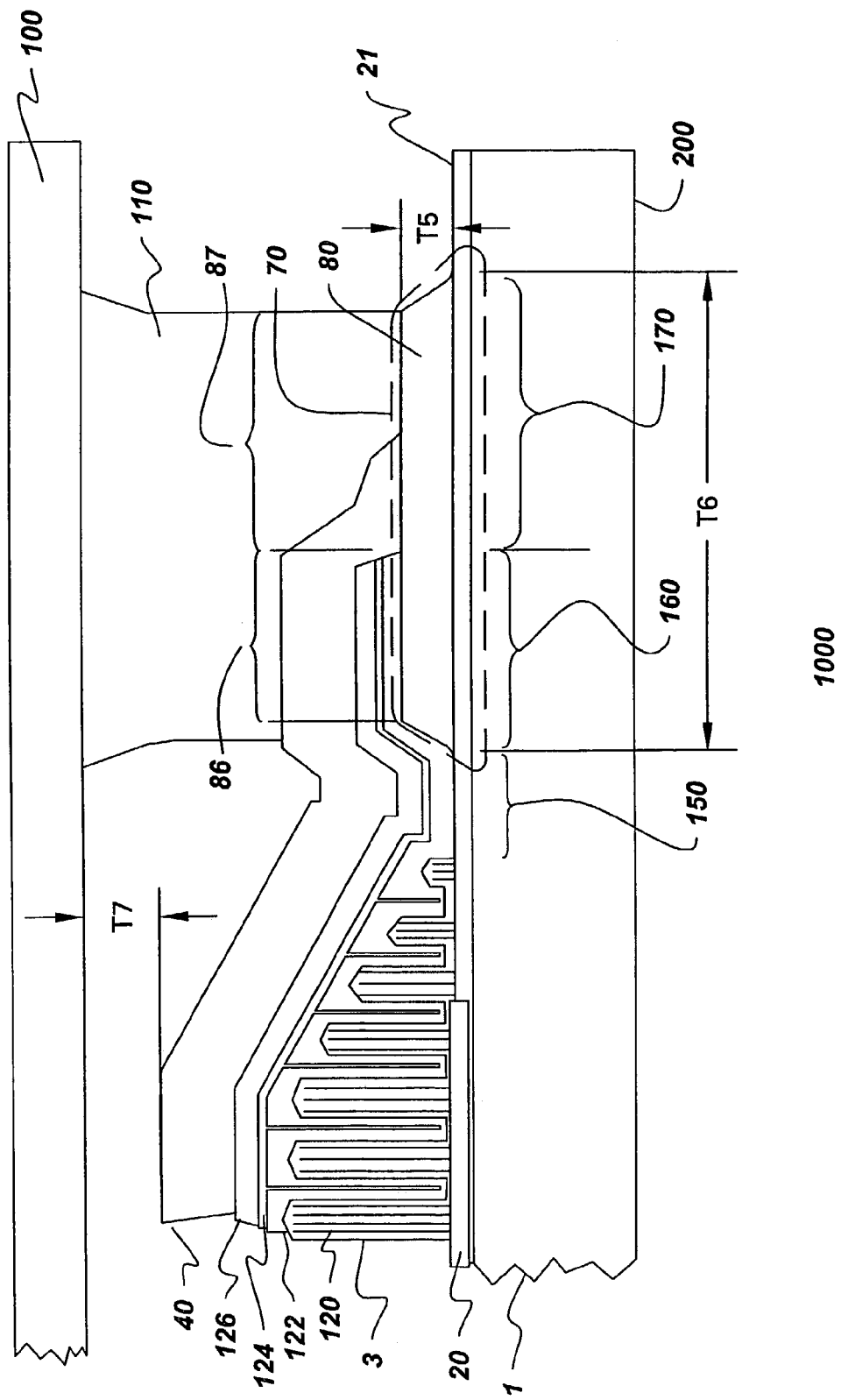

In another embodiment of the present invention, the encapsulating coating 4 of FIG. 6, further comprises a first encapsulating coating tier 122 of FIG. 12 disposed on scintillator material 3 of FIG. 6 and a detector substrate first portion 150. An inner reflective tier 124 of FIG. 12 is disposed on first encapsulating coating tier 122 and a second encapsulating coating tier 126 of FIG. 12 is disposed on inner reflective tier 124.

First encapsulating coating tier 122 of FIG. 12 typically comprises at least one polymer comprising para-xylylene moieties as structural units. In various embodiments, the polymers may comprise structural units derived from unsubstituted or substituted para-xylylene moieties. In one embodiment of the present invention, the first encapsulating coating tier 122 is selected form a group consisting of poly-para-xylylene material (parylene™ N), mono-chloro-poly-para-xylylene material (parylene™ C), di-chloro-poly-para-xylylene material (parylene™ D), and combinations thereof. Preferably, the first encapsulating coating tier 122 comprises a combination of a mono-chloro-poly-para-xylylene layer and a poly-para-xylylene layer. In particular, a poly-para-xylylene layer is disposed deeply into the needle structure of the scintillator material and a mono-chloro-poly-para-xylylene layer provides a capping layer over the poly-para-xylylene layer. In this embodiment, the poly-para-xylylene layer has a thickness ranging from about 0.01 microns to about 3 microns, which is sufficient to coat the needles, but not enough to fill in spaces between the needles. The mono-chloro-poly-para-xylylene layer has a thickness ranging from about 2 microns to about 10 microns.

The inner reflective tier 124 typically comprises silver (Ag). The second encapsulating coating tier 126 typically comprises least one polymer comprising para-xylylene moieties as structural units. In various embodiments, the polymers may comprise structural units derived from unsubstituted or substituted para-xylylene moieties. In one embodiment of the present invention, the second encapsulating coating tier 126 is selected form a group consisting of poly-para-xylylene material (parylene™ N), mono-chloro-poly-para-xylylene material (parylene™ C), di-chloro-poly-para-xylylene material parylene™ D), and combinations thereof. First encapsulating coating tier 122 of FIG. 12 typically has a thickness in a range between about 1 microns to about 10 microns. Inner reflective tier 124 typically has, a thickness in a range between about 0.05 microns and about 0.2 microns; and second encapsulating coating tier 126 typically has a thickness in a range between about 2 micron and about 20 microns.

Detector substrate 1 of FIG. 6 further comprises the detector substrate adhesive bond area 7 disposed on detector substrate 1. Moisture resistant cover 2 further comprises the moisture resistant cover adhesive bond area 9 disposed on moisture resistant cover 2. Adhesive material 6 is disposed between detector substrate adhesive bond area 7 and moisture resistant cover adhesive bond area 9, where encapsulating coating 4 is not disposed therebetween. Detector substrate adhesive bond area 7 has a width (designated "T1" in FIG. 6) and moisture resistant cover adhesive bond area 9 has a width (designated "T2" in FIG. 6). The detector substrate 1, moisture resistant cover 2, and adhesive material 6 are disposed to form a moisture vapor barrier 8.

In another embodiment of the present invention, X-ray detector assembly 1000 of FIG. 6 further comprises a reflective layer 5 disposed on encapsulating coating 4. As noted herein, "on", "over", "above" and the like are used to refer to relative locations of items illustrated in the drawings and do not imply structural or operational limitations in the assembled device. Moisture resistant cover 2 is commonly disposed over reflective layer 5 covering detector matrix array 20.

Figure 7:
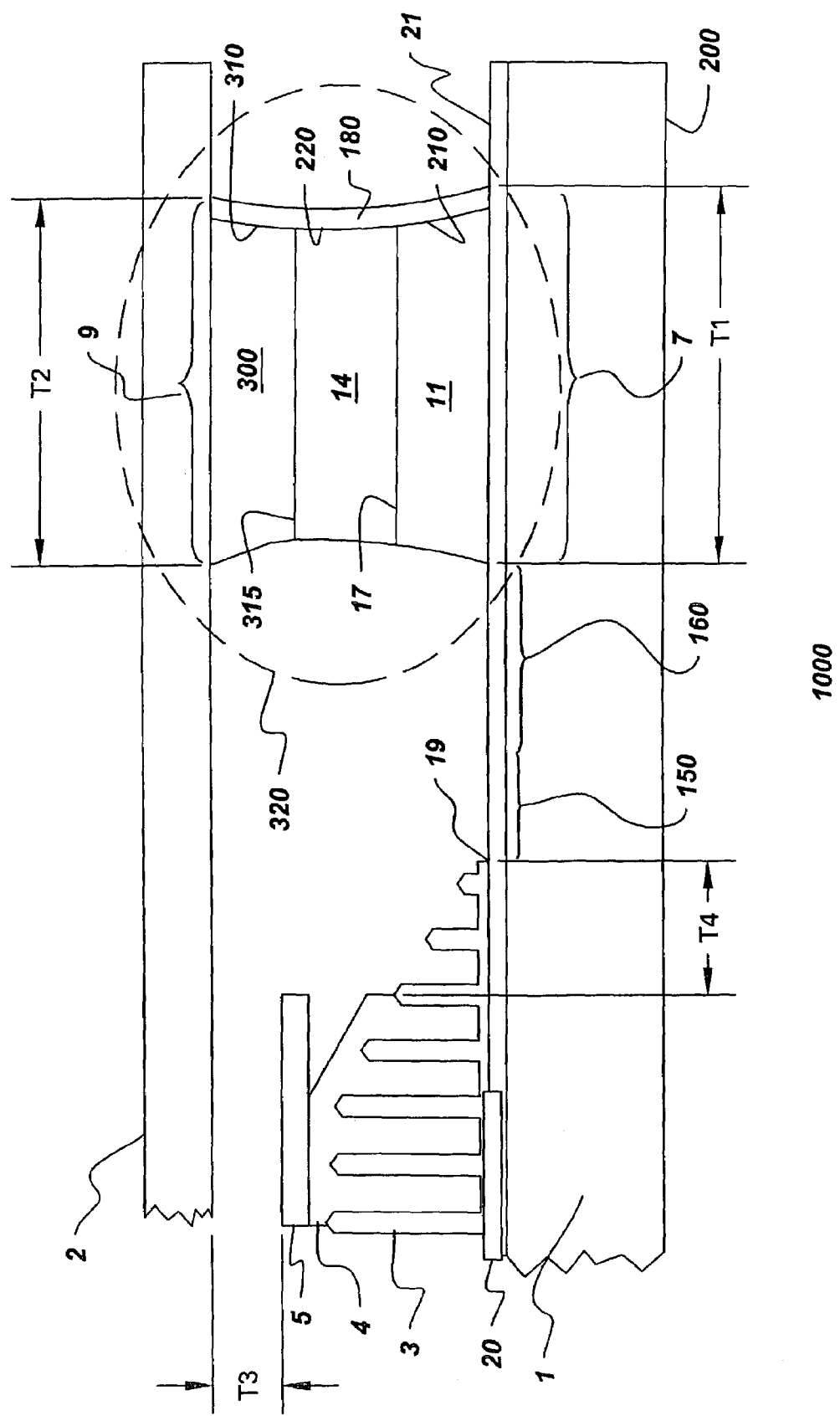

In the illustrations of the detector assembly 1000 in FIGS. 5–7, the moisture resistant cover 2 typically comprises a graphite/resin core, encapsulated by an aluminum foil.

In one embodiment, the moisture resistant cover 2 of FIG. 6 is disposed over encapsulating coating 4 and detector substrate 1, so that a gap is disposed between moisture resistant cover 2 and encapsulating coating 4. The gap is disposed between moisture resistant cover 2 and encapsulating coating 4 to have a width typically in a range between about 25 microns and about 125 microns. The range of the gap is provided for illustration purposes.

In another embodiment of the present invention, reflective layer 5 of FIG. 6 is selected from a group consisting of silver (Ag), gold (Au), titanium dioxide ($TiO_2$), Opticlad™ film, and combinations thereof. The Opticlad™ film is a polyester film with a layer of pressure sensitive adhesive, wherein the pressure sensitive adhesive further comprises about 40% by weight of titanium dioxide ($TiO_2$).

In another embodiment of the present invention, the reflective layer 5 comprises silver (Ag) typically having a thickness in a range between about 0.05 microns and about 0.20 microns.

In another embodiment of the present invention, an outer barrier 180 is disposed on an external adhesive material surface 190 of the adhesive material 6, a portion of the moisture resistant cover bond area 9 and a portion of the detector substrate adhesive bond area 7 as shown in FIG. 6. The outer barrier 180 is typically deposited by applying palladium acetate in range of between about 4 and about 6 weight percent chloroform solution and then nitrogen drying the chloroform solution. The chloroform solution is then typically irradiated with a UV248 excimer laser, to liberate the palladium. Electroless metal processing can then be used to deposit, as an example without limitation, boron nickel alloy as the outer barrier 180. Alternatively, the outer barrier 180 is generated by metal sputtering, by way of example and not limitation, aluminum, palladium, titanium, and gold. In the metal sputtering embodiment, masking of the contact pads 21 is desired to protect the contact pads 21 against possible undesired shorting due to the sputtering process. Alternatively, an inorganic insulation material forms the outer barrier 180. An example of an inorganic insulation material is without limitation a diamond-like carbon, such as Dylyn™ (a trademark of the Advanced Refractory Technology Inc. 699 Hertel Ave. Buffalo, N.Y. 14207).

In the illustration of the detector assembly 1000 in FIG. 6 the adhesive material 6 commonly comprises a single step thermoset epoxy material with a curing temperature of less than about 100 degrees C.

In another embodiment of the present invention, an X-ray detector assembly 1000 of FIG. 7 is described below with modifications noted with respect to the embodiment described above as FIG. 6. X-ray detector assembly 1000 of FIG. 7 further comprises a scintillator outer edge 19 on scintillator material 3. Encapsulating coating 4 is deposited on scintillator material 3 to within a range (designated "T4" in FIG. 7) between about 0 microns and about 1500 microns of scintillator outer edge 19. The T4 range is provided for illustration purposes and is not intended to suggest a limitation.

Moisture resistant cover 2 is disposed over reflective layer 5 and detector substrate 1, so that a gap is disposed between moisture resistant cover 2 and reflective layer 5. The gap is disposed between moisture resistant cover 2 and reflective layer 5 to have a width T3.

Alternatively, as illustrated in FIGS. 3–5, first epoxy layer 11 and second epoxy layer 14 commonly comprise a two step thermoset epoxy material with a curing temperature of less than about 100 degrees C. When the encapsulating coating 4 of FIG. 5 comprises at least one polymer comprising para-xylylene moieties as structural units, the encapsulating coating 4 does not extend over interface 17.

In another embodiment of the present invention, when a two step epoxy comprising the first epoxy layer 11 of FIG. 5 and the second epoxy layer 14 are formed, the outer barrier 180 is disposed on an external first epoxy layer surface 210 of the first epoxy layer 11, an external second epoxy layer surface 220 of the second epoxy layer 14, a portion of the moisture resistant cover bond area 9 and a portion of the detector substrate bond area 7. The outer barrier 180 deposition methods and materials used are described above.

In another embodiment of the present invention, shown in the FIG. 7, three epoxy layers commonly comprise the adhesive material 6 of FIG. 6, wherein the first epoxy layer 11 of FIG. 7 is disposed to the detector substrate adhesive bond area 7, the second epoxy layer 14 is disposed to the first epoxy layer 11 at the interface 17, the third epoxy layer 300 is disposed to the second epoxy layer 14 at a second interface 315 and the third epoxy layer 300 is disposed to the moisture resistant cover adhesive bond area 9. The moisture resistant cover 2, third epoxy layer 300, second epoxy layer 14, first epoxy layer 11 and the detector substrate 1 are disposed to form the moisture vapor triple epoxy barrier 320.

In another embodiment of the present invention, when three epoxy layers are disposed between the moisture resistant cover 2 and the detector substrate 1, the outer barrier 180 shown in FIG. 7 is disposed on the external first epoxy layer surface 210 of the first epoxy layer 11, the external second epoxy layer surface 220 of the second epoxy layer 14, an external third epoxy layer surface 310 of the third epoxy layer 300, a portion of the moisture resistant cover bond area 9 and a portion of the detector substrate bond area 7. The outer barrier 180 deposition methods and materials used are described above.

The number of epoxy layers disposed between the moisture resistant cover 2 and the detector substrate 1 is not limited to those discussed above. The single adhesive, two layer epoxy and three layer epoxy methods are provided for illustration and in no way implies a limitation. The final number of epoxy layers chosen is dependent on the X-ray detector assembly fabrication steps chosen and the final number of epoxy layers is left to the determination of the artisan.

A fabrication method for X-ray detector assembly 1000 of FIG. 5 typically comprises the use of a two step epoxy material as the adhesive material 6. Encapsulating coating 4 typically comprises at least one polymer comprising para-xylylene moieties as structural units in this application. As mentioned above, the encapsulating coating comprises a combination of a mono-chloro-poly-para-xylylene layer and a poly-para-xylylene layer, wherein a poly-para-xylylene layer is disposed over the scintillator material and a mono-chloro-poly-para-xylylene layer is disposed over the poly-para-xylylene layer. Scintillator material 3 is deposited on detector matrix array 20. Detector matrix array 20 is disposed on detector substrate 1 having contact pads 21. First epoxy layer 11 is typically disposed on detector substrate adhesive bond area 7 prior to depositing the encapsulating coating 4 on scintillator material 3, detector substrate first portion 150, detector substrate second portion 160, interface 17, contact pads 21, and a non-active underside 200 of detector substrate 1. Encapsulating coating 4 is then removed from interface 17, contact pads 21, detector substrate second portion 160 and the non-active underside 200 of detector substrate 1. Encapsulating coating 4 is removed by means of selective etching and the like, using a process such as Reactive Ion Etching (RIE) which utilizes an oxygen gas. Moisture resistant cover 2, having moisture resistant cover adhesive bond area 9, is disposed over detector substrate 1 and encapsulating coating 4. Second epoxy layer 14 of FIG. 5 is then disposed on moisture resistant cover adhesive bond area 9 so as to contact first epoxy layer 11 at interface 17. Moisture resistant cover adhesive bond area 9, detector substrate adhesive bond area 7, first epoxy layer 11, and second epoxy layer 14 form moisture vapor dual epoxy barrier 16.

In another embodiment of the present invention the encapsulating coating 4 is also removed detector substrate second portion 150 (not shown in FIG. 5).

The step of disposing the encapsulating coating 4 in the fabrication method for X-ray detector assembly 1000 of FIG. 5 alternatively comprises disposing a first encapsulating coating tier 122 as shown in FIG. 12 on scintillator material 3 of FIG. 5, detector substrate first portion 150, detector substrate second portion 160, interface 17 and contact pads 21. Next, an inner reflective tier 124 as shown in FIG. 12 is deposited on first encapsulating coating tier 122; and then a second encapsulating coating tier 126 is disposed on inner reflective tier 124.

A fabrication method for X-ray detector assembly 1000 of FIG. 6 is described below with modifications noted with respect to the fabrication method described above for FIG. 5. In the FIG. 6 application, the detector assembly 1000 typically comprises the use of a single step adhesive material as the adhesive material 6 in the moisture vapor barrier 8. The encapsulating coating 4 typically comprises at least one polymer comprising para-xylylene moieties as structural units. In various embodiments, the polymers may comprise structural units derived from unsubstituted or substituted para-xylylene moieties. In particular, the encapsulating coating 4 is selected form a group consisting of a poly-para-xylylene material (parylene™ N), mono-chloro-poly-para-xylylene material (parylene™ C), di-chloro-poly-para-xylylene material (parylene™ D), and combinations thereof. As mentioned above, the encapsulating coating preferably comprises a combination of a mono-chloro-poly-para-xylylene layer and a poly-para-xylylene layer, wherein a poly-para-xylylene layer is disposed over the scintillator material and a mono-chloro-poly-para-xylylene layer is disposed over the poly-para-xylylene layer. Typically, encapsulating coating 4 is initially deposited on scintillator material 3, detector substrate first portion 150, detector substrate second portion 160, detector substrate adhesive bond area 7, contact pads 21 and non-active underside 200 of detector substrate 1. Encapsulating coating 4 is then removed from detector substrate adhesive bond area 7, detector substrate second portion 160, contact pads 21, and non-active underside 200 of detector substrate 1. Adhesive material 6 is disposed between detector substrate adhesive bond area 7 and moisture resistant cover adhesive bond area 9 so as to form the moisture vapor barrier 8. Alternatively, the two epoxy layer approach as discussed above for FIG. 5 can be used to comprise the adhesive material 6 that attaches the moisture resistant cover 2 to the detector substrate 1.

In another embodiment of the present invention the encapsulating coating 4 is also removed from detector substrate second portion 150 (not shown in FIG. 6). In the present invention a "portion" of the detector substrate is defined to be the detector substrate first portion 150, detector substrate second portion 160, detector substrate adhesive bond area 7, contact pads 21 and non-active underside 200 of detector substrate 1.

A fabrication method for X-ray detector assembly 1000 of FIG. 7 is described below with modifications noted with respect to the fabrication method described above for the detector assembly of FIG. 5. In the embodiment of the present invention shown in FIG. 7 three epoxy layers are disposed between the moisture resistant cover 2 and the detector substrate 1 as discussed above. First epoxy layer 11 is typically disposed on detector substrate adhesive bond area 7 and the third epoxy layer 300 is typically disposed on the moisture resistant cover adhesive bond area 9 prior to depositing the encapsulating coating 4 on scintillator material 3, detector substrate first portion 150, detector substrate second portion 160, interface 17, contact pads 21, and a non-active underside 200 of detector substrate 1. The encapsulating coating 4 typically comprises at least one polymer comprising para-xylylene moieties as structural units. In various embodiments, the polymers may comprise structural units derived from unsubstituted or substituted para-xylylene moieties. In particular, the encapsulating coating 4 is selected form a group consisting of poly-para-xylylene material (parylene™ N), mono-chloro-poly-para-xylylene material (parylene™ C), a di-chloro-poly-para-xylylene material (parylene™ D), and combinations thereof. The encapsulating coating 4 is removed from a portion of scintillator material 3 covering a portion of detector substrate 1 typically that does not cover detector matrix array 20. The encapsulating coating 4 is removed from the scintillator outer edge 19 towards detector matrix array 20 in a range (designated "T4" in FIG. 7) typically in a range between about 0 microns and 1500 microns. Encapsulating coating 4 is also removed from detector substrate first portion 150, detector substrate second portion 160, detector substrate adhesive bond area 7, contact pads 21, and non-active underside 200 of detector substrate 1. The second epoxy layer 14 is disposed between the first epoxy layer 11 at interface 17 and third epoxy layer 300 at second interface 315. Moisture resistant cover adhesive bond area 9, detector substrate adhesive bond area 7, second epoxy layer 14, first epoxy layer 11, and third epoxy layer 300 form the moisture vapor triple epoxy barrier 320. Alternatively, the two epoxy layer approach as discussed above for FIG. 5 can be used to attach the moisture resistant cover 2 to the detector substrate 1, or the adhesive material 6 approach as discussed above for FIG. 6 can be used to attach the moisture resistant cover 2 to the detector substrate 1.

The step of disposing the encapsulating coating 4 in the fabrication methods for X-ray detector assembly 1000 of FIGS. 5, 6 and 7 alternatively comprises disposing a first encapsulating coating tier 122 as shown in FIG. 12 on scintillator material 3, detector substrate first portion 150 of FIG. 7, detector substrate second portion 160, detector substrate adhesive bond area 7, contact pads 21 and non-active underside 200 of detector substrate 1. Next, an inner reflective tier 124 as shown in FIG. 12 is deposited on first encapsulating coating tier 122; and then a second encapsulating coating tier 126 is disposed on inner reflective tier 124. Both the first encapsulating coating tier 122 and the second encapsulating coating tier 126 typically comprises at least one polymer comprising para-xylylene moieties as structural units. In various embodiments, the polymers may comprise structural units derived from unsubstituted or substituted para-xylylene moieties. In one embodiment of the present invention, the first encapsulating coating tier 122 comprises a combination of a mono-chloro-poly-para-xylylene layer and a poly-para-xylylene layer, wherein a poly-para-xylylene layer is disposed over the scintillator material and a mono-chloro-poly-para-xylylene layer is disposed over the poly-para-xylylene layer. The encapsulating coating tier 126 is selected form a group consisting of poly-para-xylylene material (parylene™ N), mono-chloro-poly-paraxylylene material (parylene™ C), di-chloro-poly-para-xylylene material (parylene™ D), and combinations thereof.

In one alternative embodiment, the step of removing the encapsulating coating 4 in the fabrication methods for X-ray detector assembly 1000 of FIG. 7 alternatively comprises placing a metallic hard mask (not shown) over the encapsulating material 4 such that the metallic hard mask does not cover the area designated as T4 as described above, detector substrate first portion 150, detector substrate second portion 160, detector substrate adhesive bond area 7, contact pads 21 and non-active underside 200 of detector substrate 1. The encapsulating coating 4 is then typically removed by RIE utilizing an oxygen gas from the area designated as T4 as described above, detector substrate first portion 150, detector substrate second portion 160, detector substrate adhesive bond area 7, contact pads 21 and non-active underside 200 of detector substrate 1. The metallic hard mask is then removed.

In another alternative embodiment, the step of removing the encapsulating coating 4 in the fabrication method for X-ray detector assembly 1000 of FIG. 7 alternatively comprises, utilizing Opticlad™ as the reflective layer 5 and depositing the reflective layer 5 onto the encapsulating material 4 prior to removal of any excess encapsulating material 4. The reflective layer 5 is deposited so as to cover the active portion of the detector substrate, but not cover the area designated as T4 as described above, detector substrate first portion 150, detector substrate second portion 160, detector substrate adhesive bond area 7, contact pads 21 and non-active underside 200 of detector substrate 1. The encapsulating coating 4 is then typically removed by RIE utilizing an oxygen gas, where the Opticlad™ serves the function of the metallic hard mask, form the area designated as T4, detector substrate first portion 150, detector substrate second portion 160, detector substrate adhesive bond area 7, contact pads 21 and non-active underside 200 of detector substrate 1.

In the illustrations of FIGS. 8–12, a moisture resistant layer 40 or a combination of the moisture resistant layer 40 and planarized adhesive layer 80 are typically utilized in place of the moisture resistant cover 2 and adhesive material 6. The encapsulating coating 4 typically comprises at least one polymer comprising para-xylylene moieties as structural units. In various embodiments, the polymers may comprise structural units derived from unsubstituted or substituted para-xylylene moieties. In one embodiment of the present invention, the encapsulating coating 4 preferably comprises a combination of a mono-chloro-poly-para-xylylene layer and a poly-para-xylylene layer, wherein a poly-para-xylylene layer is disposed over the scintillator material and a mono-chloro-poly-para-xylylene layer is disposed over the poly-para-xylylene layer.

Figure 8:
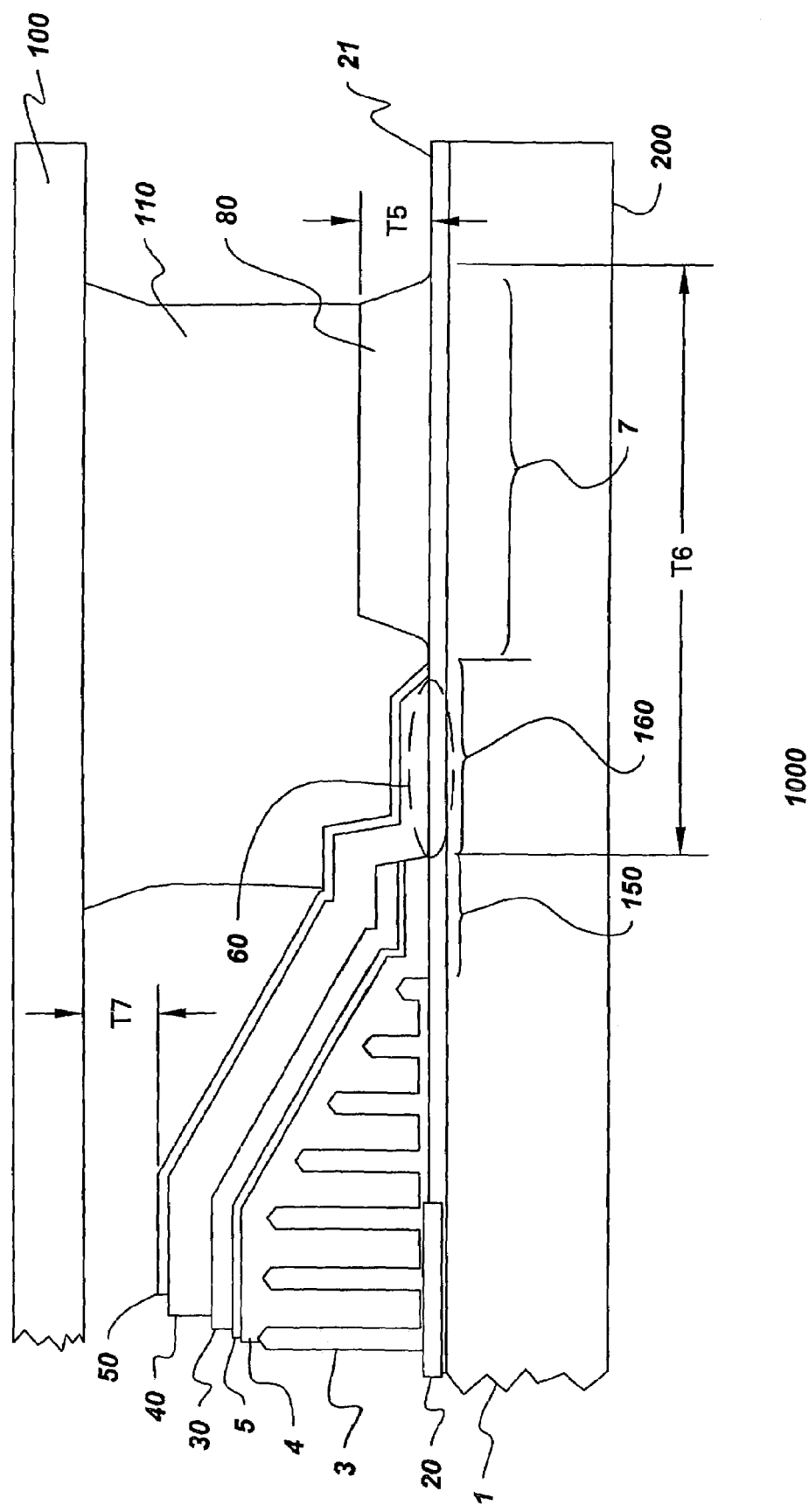

In another embodiment of the present invention, an X-ray detector assembly 1000 of FIG. 8 is described below with modifications noted with respect to the embodiment described above as FIG. 6. Reflective layer 5 is disposed on encapsulating coating 4. A thin film mask 30 of FIG. 8 is disposed on reflective layer 5. The moisture resistant layer 40 is disposed on thin film mask 30 so as to extend over and terminate on detector substrate second portion 160 adjacent to reflective layer 5. The moisture resistant layer 40 and detector substrate second portion 160 provide a humidity barrier 60.

In another embodiment of the present invention, the encapsulating coating 4 of FIG. 8, further comprises the first encapsulating coating tier 122 of FIG. 12, the inner reflective tier 124 of FIG. 12 and the second encapsulating coating tier 126 of FIG. 12 as described above for the FIG. 6 embodiment.

Thin film mask 30 of FIG. 8 is typically selected from the group consisting of aluminum (Al), magnesium fluoride (MgF), diamond-like carbon, boron carbide ($B_4C$), boron nitride ($BNO_2$), silicon nitrate ($SiNO_3$), and silicon oxide (SiO).

Alternatively, X-ray detector assembly 1000 of FIG. 8 may not have a thin film layer 30 disposed between reflective layer 5 and moisture resistant layer 40. In this embodiment of the present invention, moisture resistant layer 40 is disposed on reflective layer 5 so as to extend over and terminate on detector substrate second portion 160 adjacent to reflective layer 5.

X-ray detector assembly 1000 of FIG. 8 commonly further comprises a corrosion protection layer 50 that is disposed on moisture resistant layer 40 so as to terminate on detector substrate second portion 160 adjacent to moisture resistant layer 40.

Suitable material choices for corrosion protection layer 50 comprise materials having preferably low X-ray absorption, typically less than about 2% to reduce the degradation of the X ray detector assembly 1000. These low X-ray absorption corrosion protection layer 50 materials typically have a thickness in range between about 1 micron and about 100 microns. The corrosion protection layer 50 materials are commonly selected from the group consisting of aluminum (Al), aluminum oxide (AlO), magnesium fluoride (MgF), diamond-like carbon, boron carbide ($B_4C$), boron nitride ($BNO_2$), silicon nitrate ($SiNO_3$), silicon oxide (SiO), gold (Au), acrylic, at least one polymer comprising para-xylylene moieties as structural units, at least one polymer comprising structural units derived from unsubstituted, at least one polymer comprising substituted para-xylylene moieties. In one embodiment of the present invention, the corrosion protection layer 50 is selected form a group consisting of poly-para-xylylene material (parylene™ N), mono-chloro-poly-para-xylylene material (parylene™ C), di-chloro-poly-para-xylylene material (parylene™ D), and combinations thereof.

Figure 9:
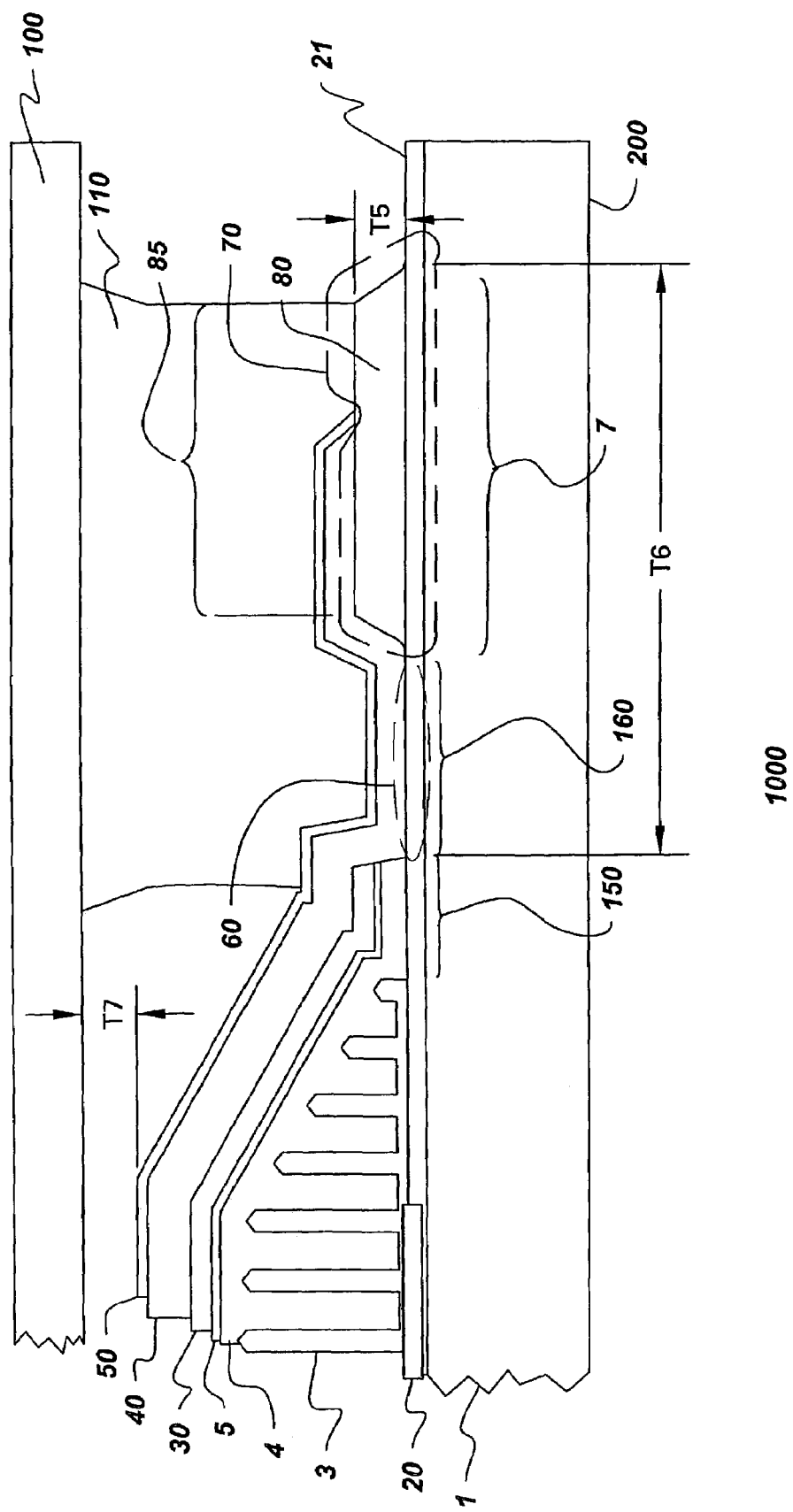

The combined width of detector substrate second portion 160 and detector substrate third portion 170 (designated as "T6" in FIGS. 8–12) typically has a range between about 3050 microns and about 4850 microns. The range of the T6 width is provided for illustration purposes and the range of the T6 width is not intended to suggest a limitation. In another alternative embodiment a planarized epoxy layer 80 is disposed over the detector substrate third portion 170 as depicted in FIGS. 8 and 9.

In another embodiment of the present invention when the corrosion protection layer 50 is not disposed on the moisture resistant layer 40 and the planarized adhesive layer 80 is not disposed on the detector substrate third portion 170, X-ray detector assembly 1000 of FIG. 8 further typically comprising a protective cover 100 and a protective cover epoxy 110. Protective cover 100 is disposed over moisture resistant layer 40 and detector substrate third portion 170. Protective cover epoxy 110 is disposed between detector substrate third portion 170 and protective cover 100; protective cover epoxy 110 is disposed between moisture resistant layer 40 disposed over detector substrate second portion 160 and protective cover 100. Encapsulating coating 4 is disposed so that it does not extend over detector substrate third portion 170.

In another embodiment of the present invention when the corrosion protection layer 50 is disposed on the moisture resistant layer 40 and the planarized adhesive layer 80 is not disposed on the detector substrate third portion 170, X-ray detector assembly 1000 of FIG. 8 further typically comprising a protective cover 100 and a protective cover epoxy 110. Protective cover 100 is disposed over corrosion protection layer 50 and detector substrate third portion 170. Protective cover epoxy 110 is disposed between detector substrate third portion 170 and protective cover 100; protective cover epoxy 110 is disposed between corrosion protection layer 50 disposed over detector substrate second portion 160 and protective cover 100. Encapsulating coating 4 is disposed so that it does not extend over detector substrate third portion 170.

In another embodiment of the present invention when the corrosion protection layer 50 is not disposed on the moisture resistant layer 40 and the planarized adhesive layer 80 is disposed on the detector substrate third portion 170, X-ray detector assembly 1000 of FIG. 8 further typically comprising a protective cover 100 and a protective cover epoxy 10. Protective cover 100 is disposed over moisture resistant layer 40 and planarized adhesive layer 80. Protective cover epoxy 110 is disposed between planarized adhesive layer 80 and protective cover 100; protective cover epoxy 110 is disposed between moisture resistant layer 40 disposed over detector substrate second portion 160 and protective cover 100. Encapsulating coating 4 is disposed so that it does not extend over planarized adhesive layer 80.

In another embodiment of the present invention when the corrosion protection layer 50 is disposed on the moisture resistant layer 40 and the planarized adhesive layer 80 is disposed on the detector substrate third portion 170, X-ray detector assembly 1000 of FIG. 8 further typically comprising a protective cover 100 and a protective cover epoxy 110. Protective cover 100 is disposed over corrosion protection layer 50 and planarized adhesive layer 80. Protective cover epoxy 110 is disposed between planarized adhesive layer 80 and protective cover 100; protective cover epoxy 110 is disposed between corrosion protection layer 50 disposed over detector substrate second portion 160 and protective cover 100. Encapsulating coating 4 is disposed so that it does not extend over planarized adhesive layer 80.

In another embodiment of the present invention, protective cover 100 of FIGS. 8–12 is disposed over moisture resistant layer 40 with a gap disposed between protective cover 100 and moisture resistant layer 40. The gap disposed between protective cover 100 and moisture resistant layer 40 is designated as "T7" in FIG. 12.

In another embodiment of the present invention, protective cover 100 of FIGS. 8–12 is disposed over corrosion protection layer 50 with a gap disposed between protective cover 100 and moisture resistant layer 40. The gap disposed protective cover 100 and corrosion protection layer 50 is designated as "T7" in FIG. 8.

The X-ray detector assembly 1000 as shown in FIG. 8 typically is fabricated as follows: An adhesive material is deposited on the detector substrate 1 in detector substrate third portion 170. In one embodiment of the present invention the adhesive material is an epoxy material. In one embodiment of the present invention the encapsulating coating 4 typically comprises at least one polymer comprising para-xylylene moieties as structural units. In various embodiments, the polymers may comprise structural units derived from unsubstituted or substituted para-xylylene moieties. In one embodiment of the present invention, the encapsulating coating comprises a combination of a mono-chloro-poly-para-xylylene layer and a poly-para-xylylene layer, wherein a poly-para-xylylene layer is disposed over the scintillator material and a mono-chloro-poly-para-xylylene layer is disposed over the poly-para-xylylene layer.

The epoxy material is planarized with a Teflon™, (a trademark of the E. I. du Pont de Nemours and Company 1007 Market Street, Wilmington, Del. 19898), planarizing fixture (not shown) to form a planarized adhesive layer 80 that has a thickness (designated as T5 in FIG. 8) in a typical range between about 50 microns and about 1500 microns, with the preferred range being from about 100 microns to about 775 microns. The T5 thickness range is provided for illustration purposes and the T5 thickness range in not intended to suggest a limitation.

The planarizing fixture is removed after planarized adhesive layer 80 has cured. A metal alloy Kovar™ (a trademark of the CRS Holdings, Inc. 209 Baynard Building 3411 Silverside Road, Wilmington, Del. 19810), (29% Ni, 53% Fe, 17% Co and 1% trace impurities) shadow mask (not shown) is laid down on planarized adhesive layer 80, so that metal alloy shadow mask covers contact pads 21 and one edge of the metal alloy Kovar™ r shadow mask does not extend past a periphery of the detector matrix array 20 closest to the contact pads 21. Scintillator material 3 is deposited onto metal alloy shadow mask and detector substrate 1. Scintillator needles 120 grow to form scintillator material 3 and are in contact with detector matrix array 20 on detector substrate 1. The metal alloy shadow mask is removed. Encapsulating coating 4 is deposited on scintillator material 3, including coating between and along scintillator needles 120 of FIG. 12. Encapsulating coating 4 is also deposited on detector substrate first portion 150 of FIG. 8, detector substrate second portion, planarized adhesive layer 80 and contact pads 21. A contact shadow mask (not shown) is then laid down on the encapsulating coating 4 on planarized adhesive layer 80, so that the contact shadow mask covers contact pads 21 and one edge of the contact shadow mask does not extend over detector substrate first portion 150. The reflective layer 5 is deposited onto the encapsulating coating 4 covering scintillator material 3 and detector first portion 150 so as to not deposit reflective layer 5 on encapsulating coating 4 in detector substrate second portion 160, planarized adhesive layer 80 and contact pads 21. The thin film mask 30 is then deposited on the reflective layer 5. The thin film mask 30 protects the reflective layer 5 when encapsulating coating 4 is removed by an oxygen RIE. The contact shadow mask is then removed. The encapsulating coating 4 is removed with RIE from detector substrate second portion 160, planarized adhesive layer 80, and contact pads 21. A moisture resistant layer contact shadow mask (not shown) is then laid on planarized adhesive layer 80, so that moisture resistant layer contact shadow mask covers contact pads 21 and one edge of moisture resistant layer contact shadow mask does not extend over the detector substrate second portion 160. Moisture resistant layer 40 is deposited on thin film mask 30 and moisture resistant layer 40 terminates on detector substrate second portion 160 adjacent to thin film mask so as to form the humidity barrier 60 between moisture resistant layer 40 and detector substrate second portion 160.

Alternatively, when the encapsulating coating removal process does not affect reflective layer 5, the thin film mask 30 is not required; moisture resistant layer 40 is deposited on the reflective layer 5 and moisture resistant layer 40 terminates on detector substrate second portion 160 adjacent to reflective layer 5.

In another embodiment of the present invention, the step of disposing encapsulating coating 4 of FIG. 8 further typically comprises disposing first encapsulating coating tier 122 of FIG. 12 on scintillator material 3 of FIG. 8, detector substrate first portion 150, detector substrate second portion 160, planarized adhesive layer 80 and contact pads 21. Disposing inner reflective tier 124 of FIG. 12 on first encapsulating coating tier 122; and disposing second encapsulating coating tier 126 of FIG. 12 on inner reflective tier 124.

The X-ray detector assembly 1000 as shown in FIG. 8 typically is fabricated as described above for the previous FIG. 8 embodiment with the following modifications noted due to not disposing the planarized adhesive layer 80 on the detector substrate third portion 170: The encapsulating coating 4 typically comprises at least one polymer comprising para-xylylene moieties as structural units. In various embodiments, the polymers may comprise structural units derived from unsubstituted or substituted para-xylylene moieties. In one embodiment of the present invention, the encapsulating coating 4 comprises a combination of a mono-chloro-poly-para-xylylene layer and a poly-para-xylylene layer, wherein a poly-para-xylylene layer is disposed over the scintillator material and a mono-chloro-poly-para-xylylene layer is disposed over the poly-para-xylylene layer. The metal alloy Kovar™ shadow mask (not shown) is laid down on detector substrate 1, so that metal alloy shadow mask covers contact pads 21 and one edge of the metal alloy Kovar™ shadow mask does not extend past a periphery of the detector matrix array 20 closest to the contact pads 21. The scintillator material 3 is deposited as discussed above in the fabrication method embodiment as detailed for FIG. 8. The metal alloy shadow mask is removed. Encapsulating coating 4 is deposited on scintillator material 3, detector substrate first portion 150, detector substrate second portion 160, detector substrate third portion 170 and contact pads 21. The contact shadow mask (not shown) is then laid down on encapsulating coating 4 on detector substrate third portion 170, so that contact shadow mask covers contact pads 21 and one edge of the contact shadow mask does not extend over detector substrate first portion 150. The reflective layer 5 is deposited onto the encapsulating coating 4 covering scintillator material 3 and detector first portion 150 so as to not deposit reflective layer 5 on encapsulating coating 4 in detector substrate second portion 160, detector substrate third portion 170 and contact pads 21. The encapsulating coating 4 is removed with RIE using an oxygen gas from detector substrate second portion 160, detector substrate third portion 170 and contact pads 21. The moisture resistant layer contact shadow mask (not shown) is then laid on detector substrate third portion 170, so that moisture resistant layer contact shadow mask covers contact pads 21 and one edge of moisture resistant layer contact shadow mask does not extend over the detector substrate second portion 160. The moisture resistant layer 40 is deposited as presented above in the FIG. 8 fabrication method embodiment.

In another embodiment of the present invention, the step of disposing encapsulating coating 4 of FIG. 8 further comprises disposing first encapsulating coating tier 122 of FIG. 12 (not shown in FIG. 8) on scintillator material 3 of FIG. 8, detector substrate first portion 150, detector substrate second portion 160, detector substrate third portion 170 and contact pads 21. Disposing inner reflective tier 124 of FIG. 12 (not shown in FIG. 8) on first encapsulating coating tier 122; and disposing second encapsulating coating tier 126 of FIG. 12 (not shown in FIG. 8) on inner reflective tier 124.

In a further embodiment, an X-ray detector assembly 1000 of FIG. 9 is described below with modifications noted with respect to the embodiment described above as FIG. 8 with planarized adhesive layer 80 disposed on detector substrate third portion 170.

X-ray detector assembly 1000 of FIG. 9 comprises moisture resistant layer 40 is disposed on reflective layer 5 and detector substrate second portion 160 so as to terminate on a planarized adhesive layer bond area 85. Moisture resistant layer 40, planarized adhesive layer 80, and detector substrate third portion 170 are disposed to provide moisture resistant seal 70. Encapsulating coating 4 is disposed so as to not to extend over planarized adhesive layer bond area 85.

In another embodiment of the present invention, encapsulating coating 4 of FIG. 9 further comprises the first encapsulating coating tier 122 of FIG. 12, the inner reflective tier 124 of FIG. 12 and the second encapsulating coating tier 126 of FIG. 12 as described above in the FIG. 8 embodiment.

X-ray detector assembly 1000 of FIG. 9 typically further comprises thin film mask 30 disposed on reflective layer 5. Moisture resistant layer 40 is disposed on thin film mask 30 and detector substrate second portion 160 so as to terminate on planarized adhesive layer bond area 85.

Corrosion protection layer 50 commonly is disposed on moisture resistant layer 40 so as to terminate on planarized adhesive layer bond area 85 adjacent to moisture resistant layer 40.

In another embodiment of the present invention, when the corrosion protection layer 50 is not disposed on the moisture resistant layer 40, X-ray detector assembly 1000 of FIG. 9 further typically comprising a protective cover 100 and a protective cover epoxy 110. Protective cover 100 is disposed over moisture resistant layer 40 and planarized adhesive layer 80. Protective cover epoxy 110 is disposed between planarized adhesive layer 80 and protective cover 100. Protective cover epoxy 110 is disposed between moisture resistant layer 40 disposed over both detector substrate second portion 160 and detector substrate third portion 170 and protective cover 100. Encapsulating coating 4 is disposed so that it does not extend over planarized adhesive layer 80.

In another embodiment of the present invention when the corrosion protection layer 50 is disposed on the moisture resistant layer 40, X-ray detector assembly 1000 of FIG. 9 further typically comprising a protective cover 100 and a protective cover epoxy 110. Protective cover 100 is disposed over corrosion protection layer 50 and planarized adhesive layer 80. Protective cover epoxy 110 is disposed between planarized adhesive layer 80 and protective cover 100. Protective cover epoxy 110 is disposed between corrosion protection layer 50 disposed over both detector substrate second portion 160 and detector substrate third portion 170 and protective cover 100. Encapsulating coating 4 is disposed so that it does not extend over planarized adhesive layer 80.

X-ray detector assembly 1000 as depicted in FIG. 9 is fabricated as described above for fabrication method described for FIG. 8, except for the following fabrication steps described below.

Moisture resistant layer 40 is disposed on thin film mask 30, detector substrate second portion 160, and terminates on planarized adhesive layer bond area 85. Moisture resistant layer 40, planarized adhesive layer 80, and detector substrate third portion 170 are disposed to form moisture resistant seal 70. Alternatively, a corrosion protection layer 50 is commonly disposed on moisture resistant layer 40 and terminated on planarized adhesive layer bond area 85 adjacent to moisture resistant layer 40.

Figure 10:
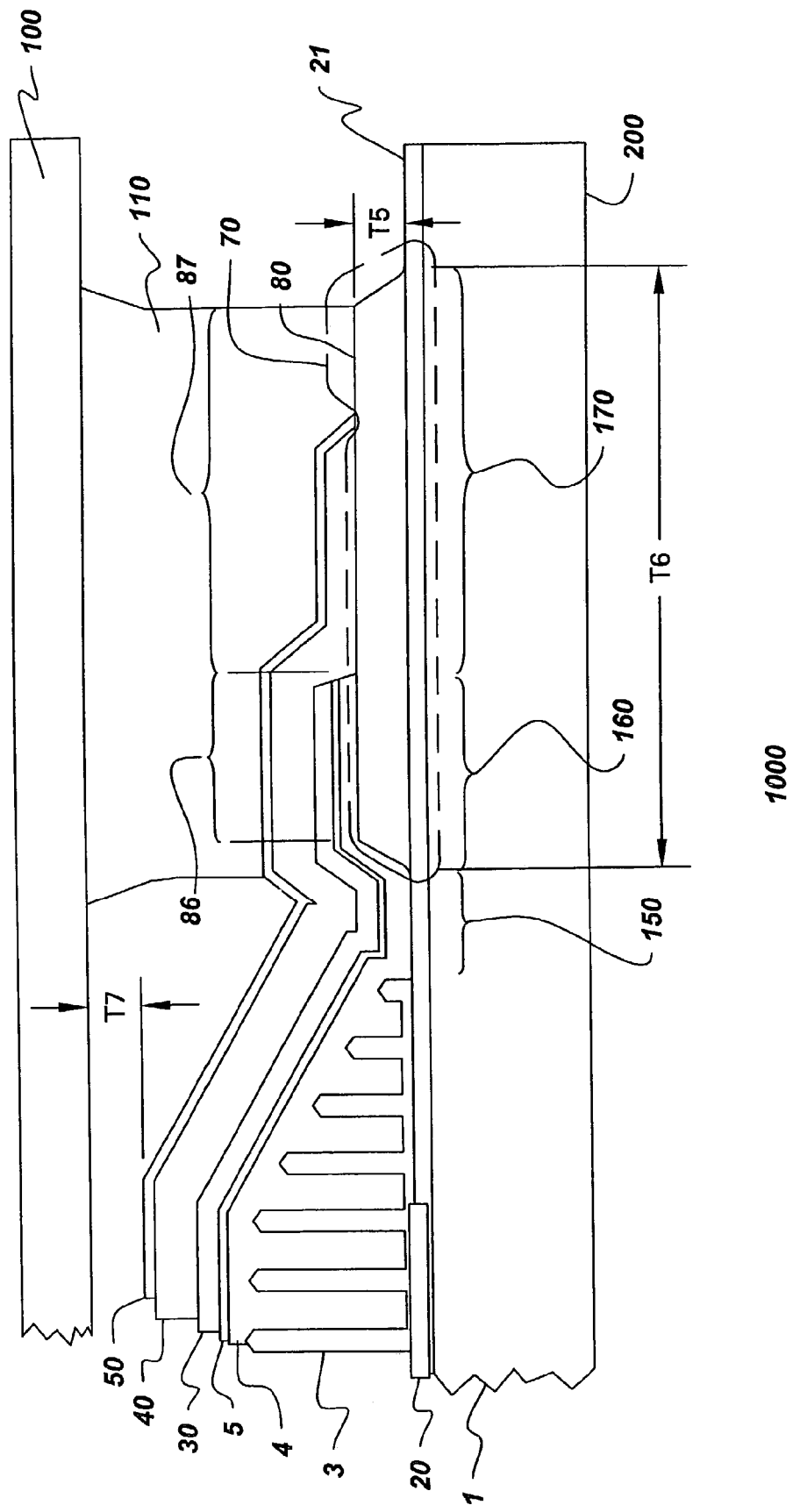

In another embodiment, X-ray detector assembly 1000 is configured as illustrated in FIG. 10 is described below with modifications noted with respect to the embodiment described above as FIG. 8. Planarized adhesive layer 80 is disposed on detector substrate second portion 160 and detector substrate third portion 170. First planarized adhesive layer bond area 86 is disposed over detector substrate second portion 160. Second planarized adhesive layer bond area 87 is disposed over the detector substrate third portion 170. Scintillator material 3 is deposited as described above for FIG. 8. Encapsulating coating 4 is disposed on scintillator material 3, detector substrate first portion 150 and first planarized adhesive layer adhesive bond area 86, but not so as to extend over second planarized adhesive layer bond area 87. Reflective layer 5 is disposed on encapsulating coating 4. Thin film mask 30 is disposed on reflective layer 5. Moisture resistant layer 40 is disposed on thin film mask 30 so as to terminate on second planarized adhesive layer adhesive bond area 87 adjacent to thin film mask 30. Moisture resistant layer 40, planarized adhesive layer 80, detector substrate second portion 160 and detector substrate third portion 170, provide moisture resistant seal 70. This embodiment does not have the humidity barrier 60 of the FIG. 8 embodiment, as the moisture resistant layer 40 does not contact the detector substrate 1.

In another embodiment of the present invention, encapsulating coating 4 of FIG. 10 further comprises a first encapsulating coating tier 122 of FIG. 12 disposed on scintillator material 3 of FIG. 10, detector substrate first portion 150 and first planarized adhesive layer bond area 86. Inner reflective tier 124 of FIG. 12 disposed on first encapsulating coating tier 122 and a second encapsulating coating tier 126 of FIG. 12 disposed on inner reflective tier 124.

In another embodiment of the present invention, X-ray detector assembly 1000 of FIG. 10 typically further comprises the protective cover 100 and the protective cover epoxy 110. The arrangement of the protective cover 100 and the protective cover epoxy 110 are the same as presented above for FIG. 9.

The X-ray detector assembly 1000 as depicted in FIG. 10 is fabricated as described above for the FIG. 8 fabrication method except for the following modified fabrication steps described below.

Planarized adhesive layer 80 is disposed on detector substrate second portion 160 and detector substrate third portion 170. Encapsulating coating 4 is disposed on scintillator material 3, detector substrate first portion 150, detector substrate second portion 160, first planarized adhesive layer bond area 86, second planarized adhesive layer bond area 87 and contact pads 21. A contact shadow mask (not shown) is then laid down on encapsulating coating 4 on planarized adhesive layer 80, so that contact shadow mask covers contact pads 21 and one edge of contact shadow mask does not extend over first planarized adhesive bond area 86 of planarized adhesive layer 80. The reflective layer 5 is then deposited onto encapsulating coating 4 so that no reflective layer 5 is deposited on encapsulating coating 4 that covers second planarized adhesive bond area 87 and contact pads 21. The thin film mask is then deposited on to the reflective layer 5 so that no thin film mask 30 is deposited on encapsulating coating 4 that is deposited on the second planarized adhesive bond area 87 and contact pads 21. The encapsulating coating 4 covering second planarized adhesive bond area 87 and contact pads 21 are removed. Moisture resistant layer contact shadow mask (not shown) is then laid on planarized adhesive layer 80, so that the moisture resistant layer contact shadow mask covers contact pads 21 and one edge of moisture resistant layer contact shadow mask does extend past approximately one half of the width of the second planarized adhesive layer bond area 87. Moisture resistant layer 40 is deposited on thin film mask 30 so as to terminate onto second planarized adhesive bond area 87 adjacent to thin film mask 30. Moisture resistant layer 40, planarized adhesive layer 80, detector substrate second portion 160 and detector substrate third portion 170 form moisture resistant seal 70. Corrosion protection layer 50 is typically disposed on moisture resistant layer 40 so as to terminate on second planarized adhesive layer bond area 87 adjacent to moisture resistant layer 40.

Figure 11:
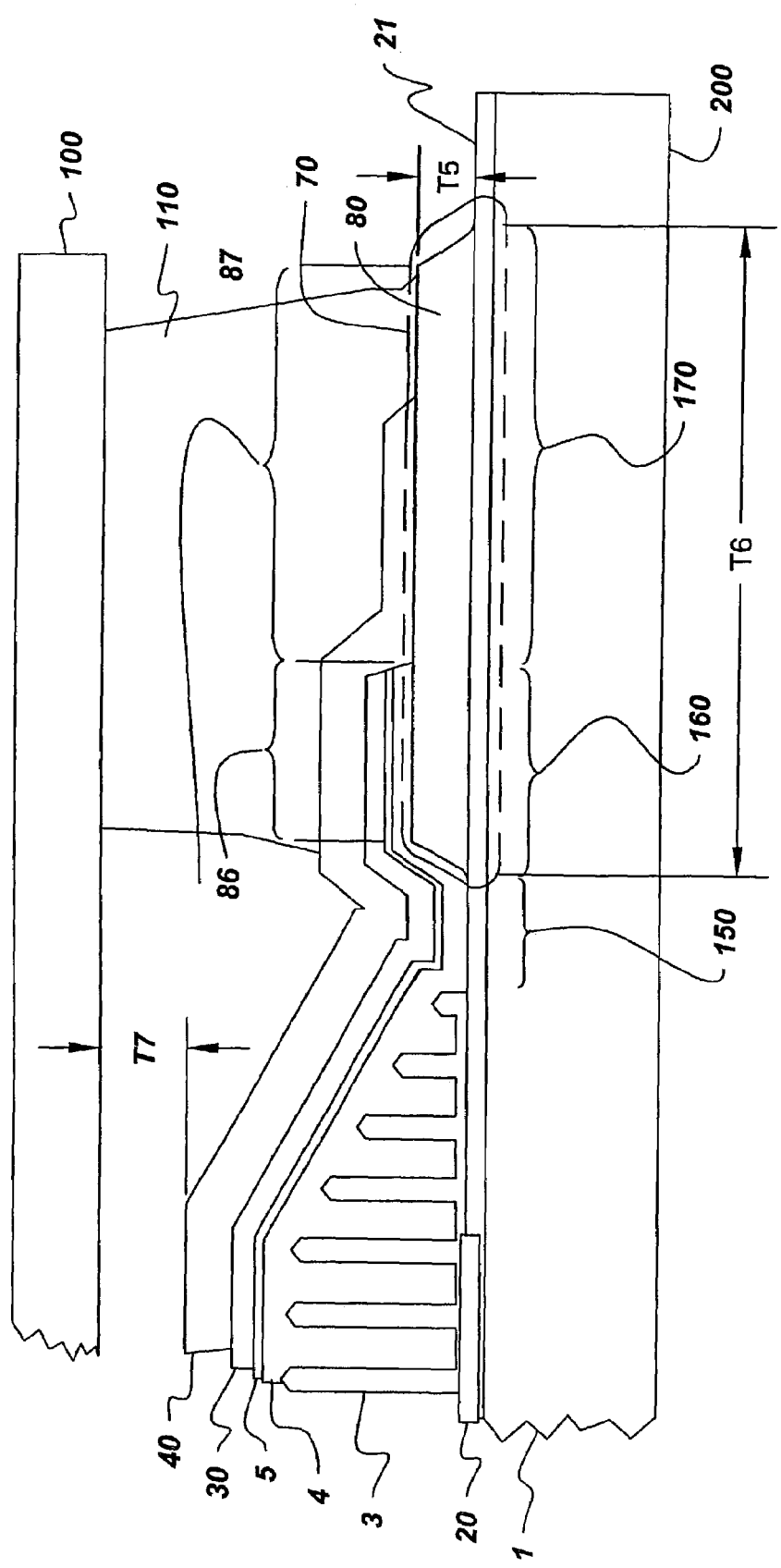

An apparatus for an X-ray detector assembly 1000 of FIG. 11 is described above in the FIG. 10 description except as noted herein.

X-ray detector assembly 1000 of FIG. 11 does not comprise the thin film mask 30 of FIG. 10; moisture resistant layer 40 is disposed on reflective layer 5 so as to terminate on second planarized adhesive layer bond area 87 adjacent to reflective layer 5. The corrosion protection layer 50 is not disposed on moisture resistant layer 40.

In another embodiment of the present invention, X-ray detector assembly 1000 of FIG. 11 may alternatively further comprises protective cover 100 and protective cover epoxy 110. The protective cover 100 and protective cover epoxy 110 has the same arrangement description as provided above for FIG. 9 for the alternative where there is no corrosion protection layer 50 disposed on moisture resistant layer 40.

In another embodiment of the present invention, X-ray detector assembly 1000 of FIG. 11 the encapsulating coating 4 alternatively comprises the first encapsulating coating tier 122 of FIG. 12, the inner reflective tier 124 and the second encapsulating coating tier 126 arranged as described above in the FIG. 10 embodiment.

An apparatus for an X-ray detector assembly 1000 of FIG. 12 is described as above for the FIG. 11 embodiment except as noted herein. In this embodiment there is no reflective layer 5 disposed between the encapsulating coating 4 and the moisture resistant layer 40, where the encapsulating coating 4 is comprised of a multi-tiered encapsulating coating structure as described above in the FIG. 10 description.

In another embodiment of the present invention, X-ray detector assembly 1000 of FIG. 12 may alternatively further comprise the protective cover 100 and the protective cover epoxy 110 arrangement described above for the FIG. 9 embodiment where the corrosion protection layer 50 does not cover the moisture resistant layer 40.

A specific embodiment of a method and apparatus for utilizing the encapsulating coating 4 in conjunction with scintillator material 3 having a needle structure to produce the X-ray detector assembly 1000 according to the present invention has been described for the purpose of illustrating the invention and the fabrication for making the invention. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation.

Accordingly, the spirit and scope of the invention are to be limited only by the terms of the appended claims.

What is claimed is:

1. An X-ray detector assembly, comprising:
a substrate;
a detector matrix array disposed on said substrate;
a scintillator material disposed on said detector matrix array; and
an encapsulating coating disposed on said scintillator material, said encapsulating coating comprising two layers of organic material disposed immediately adjacent to one another, and including a mono-chloro-poly-para-xylylene layer and a poly-para-xylylene layer.

2. The detector according to claim 1, wherein said mono-chloro-poly-para-xylylene layer has a thickness ranging from about 2 microns to about 10 microns and said poly-para-xylylene layer has a thickness ranging from about 0.01 microns to about 3 microns.

3. The detector according to claim 1, wherein said poly-para-xylylene layer is disposed over said scintillator material and said mono-chloro-poly-para-xylylene layer is disposed over said poly-para-xylylene layer.

4. The detector according to claim 3, wherein said mono-chloro-poly-para-xylylene layer has a thickness ranging from about 2 microns to about 10 microns and said poly-para-xylylene layer has a thickness ranging from about 0.01 microns to about 3 microns.

5. An X-ray detector assembly, comprising:
a substrate;
a detector matrix array disposed on said substrate;
a scintillator material disposed on said detector matrix array; and
an encapsulating coating disposed on said scintillator material, said encapsulating coating comprising two layers of organic material disposed immediately adjacent to one another, and including a poly-para-xylylene layer disposed over said scintillator material and a mono-chloro-poly-para-xylylene layer disposed over said poly-para-xylylene layer.

6. The detector according to claim 5, wherein said mono-chloro-poly-para-xylylene layer has a thickness ranging from about 2 microns to about 10 microns and said poly-para-xylylene layer has a thickness ranging from about 0.01 microns to about 3 microns.

7. An X-ray detector assembly, comprising:
a substrate;
a detector matrix array disposed on said substrate;
a scintillator material disposed on said detector matrix array; and
an encapsulating coating disposed on said scintillator material, said encapsulating coating comprising two layers of organic material disposed immediately adjacent to one another, and including a poly-para-xylylene layer having a thickness ranging from about 0.01 microns to about 3 microns disposed over said scintillator material and a mono-chloro-poly-para-xylylene layer having a thickness ranging from about 2 microns to about 10 microns disposed over said poly-para-xylylene layer.

* * * * *